United States Patent [19]
Dennen

[11] Patent Number: 5,814,869
[45] Date of Patent: *Sep. 29, 1998

[54] SHORT CHANNEL FERMI-THRESHOLD FIELD EFFECT TRANSISTORS

[75] Inventor: Michael W. Dennen, Raleigh, N.C.

[73] Assignee: Thunderbird Technologies, Inc., Research Triangle Park, N.C.

[*] Notice: The term of this patent shall not extend beyond the expiration date of Pat. No. 5,543,654.

[21] Appl. No.: 505,085

[22] Filed: Jul. 21, 1995

Related U.S. Application Data

[63] Continuation-in-part of Ser. No. 351,643, Dec. 7, 1994, Pat. No. 5,543,654, which is a continuation-in-part of Ser. No. 37,636, Feb. 23, 1993, Pat. No. 5,374,836, which is a continuation-in-part of Ser. No. 977,689, Nov. 18, 1992, Pat. No. 5,369,295, which is a continuation of Ser. No. 826,939, Jan. 28, 1992, Pat. No. 5,194,923.

[51] Int. Cl.$^6$ .............................. H01L 29/76; H01L 29/94
[52] U.S. Cl. ................... 257/408; 257/327; 257/336; 257/340; 257/344; 257/345; 257/386; 257/403; 257/404; 257/408
[58] Field of Search ...................... 257/327, 336, 257/340, 344, 345, 386, 403, 404, 408

[56] References Cited

U.S. PATENT DOCUMENTS

| Re. 32,800 | 12/1988 | Han et al. ................................... 437/27 |
| 3,653,978 | 4/1972 | Robinson et al. ........................ 148/1.5 |

(List continued on next page.)

FOREIGN PATENT DOCUMENTS

| 0070744 A3 | 7/1982 | European Pat. Off. . |
| 0073623 A2 | 8/1982 | European Pat. Off. . |
| 0 274 278 | 12/1987 | European Pat. Off. . |
| 3138747 A1 | 4/1983 | Germany . |
| 37 37 144 A1 | 11/1987 | Germany . |
| 55-87481 | 7/1980 | Japan . |
| 55-87483 | 7/1980 | Japan . |
| 56-91473 | 7/1981 | Japan . |
| 57-10268 | 1/1982 | Japan . |
| 59-29460 | 2/1984 | Japan . |
| 61-53775 | 3/1986 | Japan . |
| 61-160975 | 7/1986 | Japan . |
| 62-248255 | 10/1987 | Japan . |
| 63-53975 | 3/1988 | Japan . |
| 1-214169 | 8/1989 | Japan . |
| 02305443 | 12/1990 | Japan . |
| 6-318699 | 11/1994 | Japan . |
| 1097139 A | 4/1987 | Russian Federation . |
| WO 89/12910 | 12/1989 | WIPO . |
| WO 94/19830 | 9/1994 | WIPO . |

OTHER PUBLICATIONS

International Search Report PCT/US97/04183, Jul. 16, 1997.

(List continued on next page.)

*Primary Examiner*—Valencia Martina Wallace
*Attorney, Agent, or Firm*—Myers Bigel Sibley & Sajovec

[57] ABSTRACT

A Fermi-threshold field effect transistor includes spaced-apart source and drain regions which extend beyond the Fermi-tub in the depth direction and which may also extend beyond the Fermi-tub in the lateral direction. In order to compensate for the junction with the substrate, the doping density of the substrate region is raised to counteract the shared charge. Furthermore, the proximity of the source and drain regions leads to a potential leakage due to the drain field which can be compensated for by reducing the maximum tub depth compared to a low capacitance Fermi-FET and a contoured-tub Fermi-FET while still satisfying the Fermi-FET criteria. The tub depth is maintained below a maximum tub depth. Short channel effects may also be reduced by providing source and drain extension regions in the substrate, adjacent the source and drain regions and extending towards the channel regions. The source and drain extension regions are doped the same conductivity type and doping concentration as the source and drain themselves. A Fermi-FET which is particularly suitable for small linewidths is thereby provided.

59 Claims, 14 Drawing Sheets

U.S. PATENT DOCUMENTS

| | | | |
|---|---|---|---|
| 3,789,504 | 2/1974 | Jaddam | 29/571 |
| 3,872,491 | 3/1975 | Hanson et al. | 357/23 |
| 4,042,945 | 8/1977 | Lin et al. | 357/23 |
| 4,108,686 | 8/1978 | Jacobus, Jr. | 148/1.5 |
| 4,274,105 | 6/1981 | Crowder et al. | 357/23 |
| 4,491,807 | 1/1985 | Hoover | 331/111 |
| 4,697,198 | 9/1987 | Komori et al. | 357/23.3 |
| 4,701,775 | 10/1987 | Cosentino et al. | 357/23.12 |
| 4,737,471 | 4/1988 | Shirato et al. | 437/44 |
| 4,771,012 | 9/1988 | Yabu et al. | 437/29 |
| 4,819,043 | 4/1989 | Yazawa et al. | 357/23.3 |
| 4,831,422 | 5/1989 | Ohno | 357/233 |
| 4,841,346 | 6/1989 | Noguchi | 357/23.1 |
| 4,899,202 | 2/1990 | Blake et al. | 357/23.7 |
| 4,907,048 | 3/1990 | Huang | 357/23.9 |
| 4,928,156 | 5/1990 | Alvis et al. | 357/23.4 |
| 4,984,043 | 1/1991 | Vinal | 357/23.14 |
| 4,990,974 | 2/1991 | Vinal | 357/23.3 |
| 4,994,872 | 2/1991 | Nishizawa et al. | 357/23.4 |
| 5,119,152 | 6/1992 | Mizuno | 357/23.3 |
| 5,151,759 | 9/1992 | Vinal | 357/23.3 |
| 5,192,990 | 3/1993 | Stevens | 257/229 |
| 5,194,923 | 3/1993 | Vinal | 257/268 |
| 5,369,295 | 11/1994 | Vinal | 257/288 |
| 5,374,836 | 12/1994 | Vinal | 257/344 |
| 5,463,237 | 10/1995 | Funaki | 257/336 |
| 5,543,654 | 8/1996 | Dennen | 257/386 |

OTHER PUBLICATIONS

Hori et al., Gate–Capacitance Characteristics of Deep–Submicrons LATID (Large–Angle–Tilt Implanted Drain) MOSFET's, Proceedings of the International Electron Devices Meetings, Dec. 8, 1991, pp. 375–378.

Hiroki et al., "A High Performance 0.1μm MOSFET With Asymmetric Channel Profile", Technical Digest of the International Electron Devices Meeting (IEDM), Dec. 10, 1995, pp. 439–442.

International Search Report, PCT/US96/11968, Oct. 25, 1996.

Ohguro et al., "Tenth Micron P–MOSFET's With Ultra–Thin Epitaxial Channel Layer Grown by Ultra–High–Vacuum CVD", Proceedings of IEEE International Electron Devices Meeting, Washington, DC, Dec. 5–8, 1993, pp. 433–436.

Saito et al., "An SPDD P–MOSFET Structure Suitable for o.1 and Sub 0.1 Micron Channel Length and Its Electrical Characteristics", Proceedings of IEEE International Electron Devices Meeting, Washington, DC, Dec. 13–16, 1992, pp. 897–900.

Sansen et al., "Model and Linear Application of the JIGFET", IEDM–1974, Dec. 9–11, 1974, pp. 541–545.

Oka et al., "Two–Dimensional Analysis of Normally–Off Type Buried Channel MOSFET's", IEDM 25, Washington, DC, Dec. 3–5, 1979, pp. 30–33.

International Search Report for International Application No. PCT/US90/01158, Jul. 26, 1990.

International Search Report for International Application No. PCT/US93/00992, Jun. 2, 1993.

"Depleted Implant MOSFET", IBM Technical Disclosure, vol. 32, No. 10B, Mar. 1990, pp. 235–249.

G. Shahidi, Fabrication of CMOS on Ultrathin SOI Obtained by Epitaxial Lateral Overgrowth and Chemical–Mechanical Polishing, IEDM vol. 90, pp. 587–590, 1990.

A. Kamgar et al., Ultra–High Speed CMOS Circuits in Thin SIMOX Films, IEDM vol. 89, pp. 829–832, 1989.

S. Odanaka, et al., A New Half–Micrometer P–Channel MOSFET with Efficient Punchthrough Stops, IEEE Transactions on Electron Devices, vol. ED–33, No. 3, Mar., 1986, pp. 317–321.

S. J. Hillenius, et al., Gate Material Work Function Considerations for 0.5 Micron CMOS, IEEE, pp. 147–150, 1985.

Adele E. Schmitz, et al., High Performance Subhalf–Micrometer P–Channel Transistors for CMOS VLSI, IEDM 84, pp. 423–426.

S. Chiang, et al., Optimization of Sub–Micron P–Channel FET Structure, IEEE, pp. 534–535, 1983.

E. Takeda, et al., Submicron MOSFET Structure for Minimizing Channel Hot–Electron Injection, 1981 Symposium on VLSI Technology, Hawaii (Sep. 1981), Dig. Tech. Papers pp. 22–23.

E. Sun, et al., The Junction MOS (JMOS) Transistor –A High Speed Transistor for VLSI, IEEE, pp. 791–794, 1980.

K, Nishiuchi, et al., A Normally–Off Type Buried Channel MOSFET for VLSI Circuits, IEDM Technical Digest, 1979, pp. 26–29.

M. Hswe, et al., Characteristics of P–Channel MOS Field Effect Transistors with Ion–Implanted Channels, Solid––State Electronics, vol. 15, pp. 1237–1243, 1972.

Nguyen, "Buried–Channel MOSFETS", Chapter V of Small–Geometry MOS Transistors: Physics and Modeling of Surface–and Buried–Channel MOSFETs, Integrated Circuits Laboratory Technical Report No. G545–2, Stanford Electronics Laboratories, Aug. 1984, pp. 139–181 and 269–274.

van der Tol et al., "Potential and Electron Distribution Model for the Buried–Channel MOSFET", IEEE Transactions on Electron Devices, vol. 36, No. 4, Apr. 1989, pp. 670–689.

Chen et al., Gate and Drain Current in Off–State Buried–Type P–Channel LDD MOSFETS, IEEE Electron Device Letters, vol. 13, No. 12, Dec. 1992, pp. 654–657.

SHORT CHANNEL FERMI-THRESHOLD FIELD EFFECT TRANSISTORS

CROSS-REFERENCE TO RELATED APPLICATIONS

This application is a continuation-in-part of application Ser. No. 08/351,643 filed Dec. 7, 1994, which is itself a continuation-in-part of application Ser. No. 08/037,636, filed Feb. 23, 1993, now U.S. Pat. No. 5,374,836, which is itself a continuation-in-part of application Ser. No. 07/977,689, filed Nov. 18, 1992, now U.S. Pat. No. 5,369,295, which is itself a continuation of application Ser. No. 07/826,939, filed Jan. 28, 1992, now U.S. Pat. No. 5,194,923. The disclosures of all of these prior applications are hereby incorporated herein by reference.

FIELD OF THE INVENTION

This invention relates to field effect transistor devices and more particularly to integrated circuit field effect transistors.

BACKGROUND OF THE INVENTION

Field effect transistors (FET) have become the dominant active device for very large scale integration (VLSI) and ultra large scale integration (ULSI) applications, such as logic devices, memory devices and microprocessors, because the integrated circuit FET is by nature a high impedance, high density, low power device. Much research and development activity has focused on improving the speed and integration density of FETs, and on lowering the power consumption thereof.

A high speed, high performance field effect transistor is described in U.S. Pat. Nos. 4,984,043 and 4,990,974, both by Albert W. Vinal, both entitled Fermi Threshold Field Effect Transistor and both assigned to the assignee of the present invention. These patents describe a metal oxide semiconductor field effect transistor (MOSFET) which operates in the enhancement mode without requiring inversion, by setting the device's threshold voltage to twice the Fermi potential of the semiconductor material. As is well known to those having skill in the art, Fermi potential is defined as that potential for which an energy state in a semiconductor material has a probability of one-half of being occupied by an electron. As described in the above mentioned Vinal patents, when the threshold voltage is set to twice the Fermi potential, the dependence of the threshold voltage on oxide thickness, channel length, drain voltage and substrate doping is substantially eliminated. Moreover, when the threshold voltage is set to twice the Fermi potential, the vertical electric field at the substrate face between the oxide and channel is minimized, and is in fact substantially zero. Carrier mobility in the channel is thereby maximized, leading to a high speed device with greatly reduced hot electron effects. Device performance is substantially independent of device dimensions.

Notwithstanding the vast improvement of the Fermi-threshold FET compared to known FET devices, there was a need to lower the capacitance of the Fermi-FET device. Accordingly, in U.S. Pat. Nos. 5,194,923 and 5,369,295, both by Albert W. Vinal, and both entitled Fermi Threshold Field Effect Transistor With Reduced Gate and Diffusion Capacitance, a Fermi-FET device is described which allows conduction carriers to flow within the channel at a predetermined depth in the substrate below the gate, without requiring an inversion layer to be created at the surface of the semiconductor in order to support carrier conduction. Accordingly, the average depth of the channel charge requires inclusion of the permittivity of the substrate as part of the gate capacitance. Gate capacitance is thereby substantially reduced.

As described in the aforesaid '295 and '923 patents, the low capacitance Fermi-FET is preferably implemented using a Fermi-tub region having a predetermined depth and a conductivity type opposite the substrate and the same conductivity type as the drain and source. The Fermi-tub extends downward from the substrate surface by a predetermined depth, and the drain and source diffusions are formed in the Fermi-tub within the tub boundaries. The Fermi-tub forms a unijunction transistor, in which the source, drain, channel and Fermi-tub are all doped the same conductivity type, but at different doping concentrations. A low capacitance Fermi-FET is thereby provided. The low capacitance Fermi-FET including the Fermi-tub will be referred to herein as a "low capacitance Fermi-FET" or a "Tub-FET".

Notwithstanding the vast improvement of the Fermi-FET and the low capacitance Fermi-FET compared to known FET devices, there was a continuing need to increase the current per unit channel width which is produced by the Fermi-FET. As is well known to those skilled in the art, higher current Fermi-FET devices will allow greater integration density, and/or much higher speeds for logic devices, memory devices, microprocessors and other integrated circuit devices. Accordingly, U.S. Pat. No. 5,374,836 to Albert W. Vinal and the present inventor entitled High Current Fermi-Threshold Field Effect Transistor, describes a Fermi-FET which includes an injector region of the same conductivity type as the Fermi-tub region and the source region, adjacent the source region and facing the drain region. The injector region is preferably doped at a doping level which is intermediate to the relatively low doping concentration of the Fermi-tub and the relatively high doping concentration of the source. The injector region controls the depth of the carriers injected into the channel and enhances injection of carriers in the channel, at a predetermined depth below the gate. Transistors according to U.S. Pat. No. 5,374,836 will be referred to herein as a "high current Fermi-FET".

Preferably, the source injector region is a source injector tub region which surrounds the source region. A drain injector tub region may also be provided. A gate sidewall spacer which extends from adjacent the source injector region to adjacent the gate electrode of the Fermi-FET may also be provided in order to lower the pinch-off voltage and increase saturation current for the Fermi-FET. A bottom leakage control region of the same conductivity type as the substrate may also be provided.

Notwithstanding the vast improvement of the Fermi-FET, the low capacitance Fermi-FET and the high current Fermi-FET compared to known FET devices, there was a continuing need to improve operation of the Fermi-FET at low voltages. As is well known to those having skill in the art, there is currently much emphasis on low power portable and/or battery-powered devices which typically operate at power supply voltages of five volts, three volts, one volt or less.

For a given channel length, lowering of the operating voltage causes the lateral electric field to drop linearly. At very low operating voltages, the lateral electric field is so low that the carriers in the channel are prevented from reaching saturation velocity. This results in a precipitous drop in the available drain current. The drop in drain current effectively limits the decrease in operating voltage for obtaining usable circuit speeds for a given channel length.

In order to improve operation of the Tub-FET at low voltages, application Ser. No. 08/351,643 to the present inventor entitled Contoured-Tub Fermi-Threshold Field Effect Transistor and Method of Forming Same, describes a Fermi-FET which includes a contoured Fermi-tub region having nonuniform tub depth. In particular, the Fermi-tub is deeper under the source and/or drain regions than under the channel region. Thus, the tub-substrate junction is deeper under the source and/or drain regions than under the channel region. Diffusion capacitance is thereby reduced compared to a Fermi-tub having a uniform tub depth, so that high saturation current is produced at low voltages.

In particular, a contoured-tub Fermi-threshold field effect transistor according to application Ser. No. 08/351,643 includes a semiconductor substrate of first conductivity type and spaced-apart source and drain regions of second conductivity type in the semiconductor substrate at a face thereof. A channel region of the second conductivity type is also formed in the semiconductor substrate at the substrate face between the spaced-apart source and drain regions. A tub region of the second conductivity type is also included in the semiconductor substrate at the substrate face. The tub region extends a first predetermined depth from the substrate face to below at least one of the spaced-apart source and drain regions, and extends a second predetermined depth from the substrate face to below the channel region. The second predetermined depth is less than the first predetermined depth. A gate insulating layer and source, drain and gate contacts are also included. A substrate contact may also be included.

Preferably, the second predetermined depth, i.e. the depth of the contoured-tub adjacent the channel, is selected to satisfy the Fermi-FET criteria as defined in the aforementioned U.S. Pat. Nos. 5,194,923 and 5,369,295. In particular, the second predetermined depth is selected to produce zero static electric field perpendicular to the substrate face at the bottom of the channel with the gate electrode at ground potential. The second predetermined depth may also be selected to produce a threshold voltage for the field effect transistor which is twice the Fermi potential of the semiconductor substrate. The first predetermined depth, i.e. the depth of the contoured-tub region adjacent the source and/or drain is preferably selected to deplete the tub region under the source and/or drain regions upon application of zero bias to the source and/or drain contact.

As the state of the art in microelectronic fabrication has progressed, fabrication linewidths have been reduced to substantially less than one micron. These decreased linewidths have given rise to the "short channel" FET wherein the channel length is substantially less than one micron and is generally less than one half micron with current processing technology.

The low capacitance Fermi-FET of U.S. Pat. Nos. 5,194, 923 and 5,369,295, the high current Fermi-FET of U.S. Pat. No. 5,374,836 and the contoured tub Fermi-FET of application Ser. No. 08/351,643 may be used to provide a short channel FET with high performance capabilities at low voltages. However, it will be recognized by those having skill in the art that as linewidths decrease, processing limitations may limit the dimensions and conductivities which are attainable in fabricating an FET. Accordingly, for decreased linewidths, processing conditions may require reoptimization of the Fermi-FET transistor to accommodate these processing limitations.

SUMMARY OF THE INVENTION

It is therefore an object of the invention to provide an improved Fermi-threshold field effect transistor (Fermi-FET).

It is another object of the invention to provide a Fermi-FET which is optimized for the processing limitations of short linewidths.

These and other objects are provided, according to the present invention, by a Fermi-FET which includes spaced-apart source and drain regions which extend beyond the Fermi-tub in the depth direction and which may also extend beyond the Fermi-tub in the lateral direction. Since the source and drain regions extend beyond the tub, a junction with the substrate is formed which can lead to a charge-sharing condition. In order to compensate for this condition, the substrate doping should be increased. The very small separation between the source and drain regions leads to a desirability to reduce the tub depth. This causes a change in the static electrical field perpendicular to the substrate at the oxide:substrate interface when the gate electrode is at threshold potential. In typical long channel Fermi-FET transistors, this field is essentially zero. In short channel devices the field is significantly lower than a MOSFET transistor, but somewhat higher than a long channel Fermi-FET.

In particular, a short channel Fermi-threshold field effect transistor according to the present invention includes a semiconductor substrate of first conductivity type and a tub region of second conductivity type in the substrate at a surface thereof which extends a first depth from the substrate surface. The short channel Fermi-FET also includes spaced-apart source and drain regions of the second conductivity type in the tub region. The spaced-apart source and drain regions extend from the substrate surface to beyond the first depth, and may also extend laterally away from one another to beyond the tub region.

A channel region of the second conductivity type is included in the tub region, between the spaced-apart source and drain regions and extending a second depth from the substrate surface such that the second depth is less than the first depth. At least one of the first and second depths are selected to minimize the static electric field perpendicular to the substrate surface, from the substrate surface to the second depth when the gate electrode is at threshold potential. For example, a static electric field of $10^4$ V/cm may be produced in a short channel Fermi-FET compared to a static electric field of more than $10^5$ V/cm in a conventional MOSFET. In contrast, the Tub-FET of U.S. Pat. Nos. 5,194,923 and 5,369,295 may produce a static electric field of less than (and often considerably less than) $10^3$ V/cm which is essentially zero when compared to a conventional MOSFET. The first and second depths may also be selected to produce a threshold voltage for the field effect transistor which is twice the Fermi-potential of the semiconductor substrate, and may also be selected to allow carriers of the second conductivity type to flow from the source region to the drain region in the channel region at the second depth upon application of the threshold voltage to the gate electrode, and extending from the second depth toward the substrate surface upon application of voltage to the gate electrode beyond the threshold voltage of the field effect transistor, without creating an inversion layer in the channel. The transistor further includes a gate insulating layer and source, drain and gate contacts. A substrate contact may also be included.

The short channel Fermi-FET may also be viewed as a Tub-FET wherein the tub region extends between the spaced-apart source and drain regions and wherein the tub region extends a first depth from the substrate surface. The source and drain regions extend into the substrate beyond the first depth.

When the source and drain regions extend beyond the tub depth, charge sharing and other short channel effects may take place which lead to a degeneration in sub-threshold slope and higher drain leakage current. In order to reduce these effects, the tub depth is maintained to below a maximum tub depth. The maximum tub depth is given by:

$$Y_T = V_{g-s} \left( \frac{L_{eff} + L_D}{V_d - V_{jff} + \frac{L_D V_d}{L_{eff}}} \right) - \frac{\epsilon_s}{\epsilon_i} T_{ox}$$

where $V_{g-s}$ is the work function difference between the gate and source electrodes, $L_{eff}$ is the effective channel length, $L_D$ is the Debye length, $V_d$ is the drain voltage, $V_{jff}$ is the barrier potential for the Fermi-FET, $\epsilon_s$ is the permittivity of the substrate, $\epsilon_i$ is the permittivity of the gate insulating layer and $T_{ox}$ is the thickness of the gate insulating layer. The work function difference between the gate and source electrodes $V_{g-s}$ is given by $V_{g-s} = kT/q \, Ln(N^+ N_{poly}/n_i^2)$ wherein $N^+$ is the source doping concentration $N_{poly}$, is the doping concentration of the polysilicon gate, $n_i$ is the intrinsic carrier concentration of the substrate at temperature T degrees Kelvin, $q = 1.6 \times 10^{-19}$ coulomb and $K = 1.38 \times 10^{-23}$ Joules/°Kelvin. The barrier potential for the Fermi-FET $V_{jff}$ is given by $kT/q \, Ln(N^+/n_i)$.

Short channel effects may also be reduced by providing source and drain extension regions in the substrate at the substrate face, adjacent the source and drain regions respectively, and extending into the channel region. In contrast with "lightly doped drain" technology used in conventional FETs, the source and drain regions are doped the second conductivity type at about the same doping concentration as the source and drain themselves. The source and drain extension regions reduce the drain voltage sensitivity due to charge sharing effects. The source and drain extension regions may also be used in a contoured-tub Fermi-FET to reduce short channel effects. Accordingly, a Fermi-FET which is particularly suitable for small linewidths is provided.

DETAILED DESCRIPTION OF THE PREFERRED EMBODIMENTS

Figure 1:
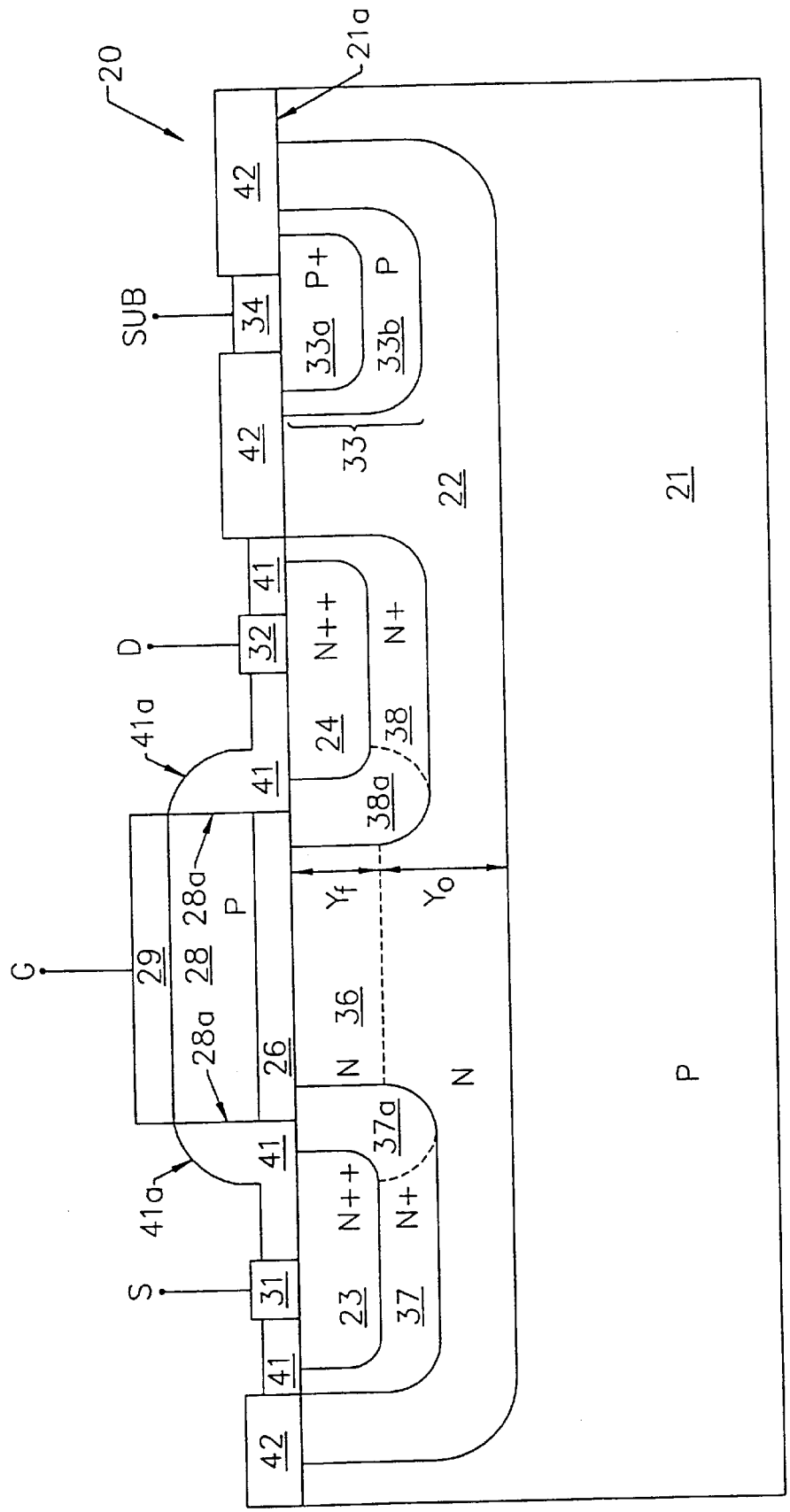
FIG. 1 illustrates a cross-sectional view of an N-channel high current Fermi-FET according to application Ser. No. 08/037,636.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Before describing a short channel Fermi-threshold field effect transistor of the present invention, a Fermi-threshold field effect transistor with reduced gate and diffusion capacitance of U.S. Pat. Nos. 5,194,923 and 5,369,295 (also referred to as the "low capacitance Fermi-FET" or the "Tub-FET") will be described as will a high current Fermi-Threshold field effect transistor of U.S. Pat. No. 5,374,836. A contoured-tub Fermi-FET according to application Ser. No. 08/351,643 will also be described. A more complete description may be found in these patents and application, the disclosures of which are hereby incorporated herein by reference. Short channel Fermi-FETs according to the present invention will then be described.

Fermi-FET With Reduced Gate and Diffusion Capacitance

The following summarizes the low capacitance Fermi-FET including the Fermi-tub. Additional details may be found in U.S. Pat. Nos. 5,194,923 and 5,369,295.

Conventional MOSFET devices require an inversion layer to be created at the surface of the semiconductor in order to support carrier conduction. The depth of the inversion layer is typically 100 Å or less. Under these circumstances gate capacitance is essentially the permittivity of the gate insulator layer divided by its thickness. In other words, the channel charge is so close to the surface that effects of the dielectric properties of the substrate are insignificant in determining gate capacitance.

Gate capacitance can be lowered if conduction carriers are confined within a channel region below the gate, where the average depth of the channel charge requires inclusion of the permittivity of the substrate to calculate gate capacitance. In general, the gate capacitance of the low capacitance Fermi-FET is described by the following equation:

$$C_g = \frac{1}{\frac{Y_f}{\beta \epsilon_s} + \frac{T_{ox}}{\epsilon_i}} \quad (1)$$

Where $Y_f$ is the depth of the conduction channel called the Fermi channel, $\epsilon_s$ is the permittivity of the substrate, and $\beta$ is the factor that determines the average depth of the charge flowing within the Fermi channel below the surface. $\beta$ depends on the depth dependant profile of carriers injected from the source into the channel. For the low capacitance Fermi-FET, $\beta \cong 2$. $T_{ox}$ is the thickness of the gate oxide layer and $\epsilon_i$ is its permittivity.

The low capacitance Fermi-FET includes a Fermi-tub region of predetermined depth, having conductivity type opposite the substrate conductivity type and the same conductivity type as the drain and source regions. The Fermi-tub extends downward from the substrate surface by a predetermined depth, and the drain and source diffusions are formed in the Fermi-tub region within the Fermi-tub boundaries. The preferred Fermi-tub depth is the sum of the Fermi channel depth $Y_f$ and depletion depth $Y_0$. A Fermi channel region with predetermined depth $Y_f$ and width Z, extends between the source and drain diffusions. The conductivity of the Fermi channel is controlled by the voltage applied to the gate electrode.

The gate capacitance is primarily determined by the depth of the Fermi channel and the carrier distribution in the Fermi channel, and is relatively independent of the thickness of the gate oxide layer. The diffusion capacitance is inversely dependant on the difference between [the sum of the depth of the Fermi-tub and the depletion depth $Y_0$ in the substrate] and the depth of the diffusions $X_d$. The diffusion depth is preferably less than the depth of the Fermi-tub, $Y_T$. The dopant concentration for the Fermi-tub region is preferably chosen to allow the depth of the Fermi channel to be greater than three times the depth of an inversion layer within a MOSFET.

Accordingly, the low capacitance Fermi-FET includes a semiconductor substrate of first conductivity type having a first surface, a Fermi-tub region of second conductivity type in the substrate at the first surface, spaced apart source and drain regions of the second conductivity type in the Fermi-tub region at the first surface, and a channel of the second conductivity type in the Fermi-tub region at the first surface between the spaced apart source and drain regions. The channel extends a first predetermined depth ($Y_f$) from the first surface and the tub extends a second predetermined depth ($Y_0$) from the channel. A gate insulating layer is provided on the substrate at the first surface between the spaced apart source and drain regions. Source, drain and gate electrodes are provided for electrically contacting the source and drain regions and the gate insulating layer respectively.

At least the first and second predetermined depths are selected to produce zero static electric field perpendicular to the first surface at the first depth, upon application of the threshold voltage of the field effect transistor to the gate electrode. The first and second predetermined depths are also selected to allow carriers of the second conductivity type to flow from the source to the drain in the channel, extending from the first predetermined depth toward the first surface upon application of the voltage to the gate electrode beyond the threshold voltage of the field effect transistor. The carriers flow from the source to the drain region beneath the first surface without creating an inversion layer in the Fermi-tub region. The first and second predetermined depths are also selected to produce a voltage at the substrate surface, adjacent the gate insulating layer, which is equal and opposite to the sum of the voltages between the substrate contact and the substrate and between the polysilicon gate electrode and the gate electrode.

When the substrate is doped at a doping density $N_s$, has an intrinsic carrier concentration $n_i$ at temperature T degrees Kelvin and a permittivity $\epsilon_s$, and the field effect transistor includes a substrate contact for electrically contacting the substrate, and the channel extends a first predetermined depth $Y_f$ from the surface of the substrate and the Fermi-tub region extends a second predetermined depth $Y_0$ from the channel, and the Fermi-tub region is doped at a doping density which is a factor $\alpha$ times $N_s$, and the gate electrode includes a polysilicon layer of the first conductivity type and which is doped at a doping density $N_p$, the first predetermined depth ($Y_f$) is equal to:

$$Y_f = \sqrt{\frac{2\epsilon_s}{qN_s\alpha} \frac{kT}{q} \ln\left(\frac{N_p}{N_s}\right)}, \quad (2)$$

where q is $1.6 \times 10^{-19}$ coulombs and K is $1.38 \times 10^{-23}$ Joules/°Kelvin. The second predetermined depth ($Y_0$) is equal to:

$$Y_o = \sqrt{\frac{2\epsilon_s \phi_s}{qN_s\alpha(\alpha+1)}}, \quad (3)$$

where $\phi_s$ is equal to $2\phi_f + kT/q \ln(\alpha)$, and $\phi_f$ is the Fermi potential of the semiconductor substrate.

High Current Fermi-FET Structure

Referring now to FIG. 1, an N-channel high current Fermi-FET according to U.S. Pat. No. 5,374,836 is illustrated. It will be understood by those having skill in the art that a P-channel Fermi-FET may be obtained by reversing the conductivities of the N and P regions.

As illustrated in FIG. 1, high current Fermi-FET 20 is fabricated in a semiconductor substrate 21 having first conductivity type, here P-type, and including a substrate surface 21a. A Fermi-tub region 22 of second conductivity type, here N-type, is formed in the substrate 21 at the surface 21a. Spaced apart source and drain regions 23 and 24, respectively, of the second conductivity type, here N-type, are formed in the Fermi-tub region 22 at the surface 21a. It will be understood by those having skill in the art that the source and drain regions may also be formed in a trench in the surface 21a.

A gate insulating layer 26 is formed on the substrate 21 at the surface 21a between the spaced apart source and drain regions 23 and 24, respectively. As is well known to those having skill in the art, the gate insulating layer is typically silicon dioxide. However, silicon nitride and other insulators may be used.

A gate electrode is formed on gate insulating layer 26, opposite the substrate 21. The gate electrode preferably includes a polycrystalline silicon (polysilicon) gate electrode layer 28 of first conductivity type, here P-type. A conductor gate electrode layer, typically a metal gate electrode layer 29, is formed on polysilicon gate electrode 28 opposite gate insulating layer 26. Source electrode 31 and drain electrode 32, typically metal, are also formed on source region 23 and drain region 24, respectively.

A substrate contact 33 of first conductivity type, here P-type, is also formed in substrate 21, either inside Fermi-tub 22 as shown or outside tub 22. As shown, substrate contact 33 is doped first conductivity type, here P-type, and may include a relatively heavily doped region 33a and a relatively lightly doped region 33b. A substrate electrode 34 establishes electrical contact to the substrate.

The structure heretofore described with respect to FIG. 1 corresponds to the low capacitance Fermi-FET structure of U.S. Pat. Nos. 5,194,923 and 5,369,295. As already described in these applications, a channel 36 is created between the source and drain regions 23 and 24. The depth of the channel from the surface 21a, designated at $Y_f$ in FIG. 1, and the depth from the bottom of the channel to the bottom of the Fermi-tub 22, designated as $Y_O$ in FIG. 1, along with the doping levels of the substrate 21, tub region 22, and polysilicon gate electrode 28 are selected to provide a high performance, low capacitance field effect transistor using the relationships of Equations (2) and (3) above.

Still referring to FIG. 1, a source injector region 37a of second conductivity type, here N-type, is provided adjacent the source region 23 and facing the drain region. The source injector region provides a high current, Fermi-FET by controlling the depth at which carriers are injected into channel 36. The source injector region 37a may only extend between the source region 23 and the drain region 24. The source injector region preferably surrounds source region 23 to form a source injector tub region 37, as illustrated in FIG. 1. Source region 23 may be fully surrounded by the source injector tub region 37, on the side and bottom surface. Alternatively, source region 23 may be surrounded by the source injector tub region 37 on the side, but may protrude through the source injector tub region 37 at the bottom. Still alternatively, source injector region 37a may extend into substrate 21, to the junction between Fermi-tub 22 and substrate 21. A drain injector region 38a, preferably a drain injector tub region 38 surrounding drain region 24, is also preferably provided.

Source injector region 37a and drain injector region 38a or source injector tub region 37 and drain injector tub region 38, are preferably doped the second conductivity type, here N-type, at a doping level which is intermediate the relatively low doping level of Fermi-tub 22 and the relatively high doping level of source 23 and drain 24. Accordingly, as illustrated in FIG. 1, Fermi-tub 22 is designated as being N, source and drain injector tub regions 37, 38 are designated as $N^+$ and source and drain regions 23, 24 are designated as $N^{++}$. A unijunction transistor is thereby formed.

The high current Fermi-FET provides drive currents that are about four times that of state of the art FETs. Gate capacitance is about half that of a conventional FET device. The doping concentration of the source injector tub region 37 controls the depth of carriers injected into the channel region 36, typically to about 1000 Å. The source injector tub region 37 doping concentration is typically 2E18, and preferably has a depth at least as great as the desired maximum depth of injected majority carriers. Alternatively, it may extend as deep as the Fermi-tub region 22 to minimize subthreshold leakage current, as will be described below. It will be shown that the carrier concentration injected into the channel 36 cannot exceed the doping concentration of the source injector region 37a facing the drain. The width of the portion of source injector region 37a facing the drain is typically in the range of 0.05–0.15 μm. The doping concentration of the source and drain regions 23 and 24 respectively, is typically 1E19 or greater. The depth $Y_T = (Y_f + Y_O)$ of the Fermi-tub 22 is approximately 2200 Å with a doping concentration of approximately 1.8E16.

As illustrated in FIG. 1, the high current Fermi-FET 20 also includes a gate sidewall spacer 41 on the substrate surface 21a, which extends from adjacent the source injector region 37a to adjacent the polysilicon gate electrode 28. Gate sidewall spacer 41 also preferably extends from adjacent the drain injector region 38a to adjacent the polysilicon gate electrode 28. In particular, as shown in FIG. 1, gate sidewall spacer 41 extends from the polysilicon gate electrode sidewall 28a and overlies the source and drain injector regions 37a and 38a respectively. Preferably the gate sidewall spacer 41 surrounds the polysilicon gate electrode 28. Also preferably, and as will be discussed in detail below, the gate insulating layer 26 extends onto the source injector region 37a and the drain injector region 38a at the substrate face 21a and the gate sidewall spacer 41 also extends onto the source injector region 37 and drain injector region 38.

The gate sidewall spacer 41 lowers the pinch-off voltage of the Fermi-FET 20 and increases its saturation current in a manner in which will be described in detail below. Preferably, the gate sidewall spacer is an insulator having a permittivity which is greater than the permittivity of the gate insulating layer 26. Thus, for example, if the gate insulating layer 26 is silicon dioxide, the gate sidewall spacer is preferably silicon nitride. If the gate insulating layer 26 is silicon nitride, the gate sidewall spacer is preferably an insulator which has permittivity greater than silicon nitride.

As shown in FIG. 1, the gate sidewall spacer 41 may also extend onto source and drain regions 23 and 24 respectively, and the source and drain electrodes 31 and 32 respectively may be formed in the extension of the gate sidewall spacer region. Conventional field oxide or other insulator 42 regions separate the source, drain and substrate contacts. It will also be understood by those having skill in the art that although the outer surface 41a of gate sidewall spacer 41 is illustrated as being curved in cross section, other shapes may be used, such as a linear outer surface to produce a triangular cross section or orthogonal outer surfaces to produce a rectangular cross section.

Low Leakage Current Fermi-Threshold Field Effect Transistor

Figure 2A:
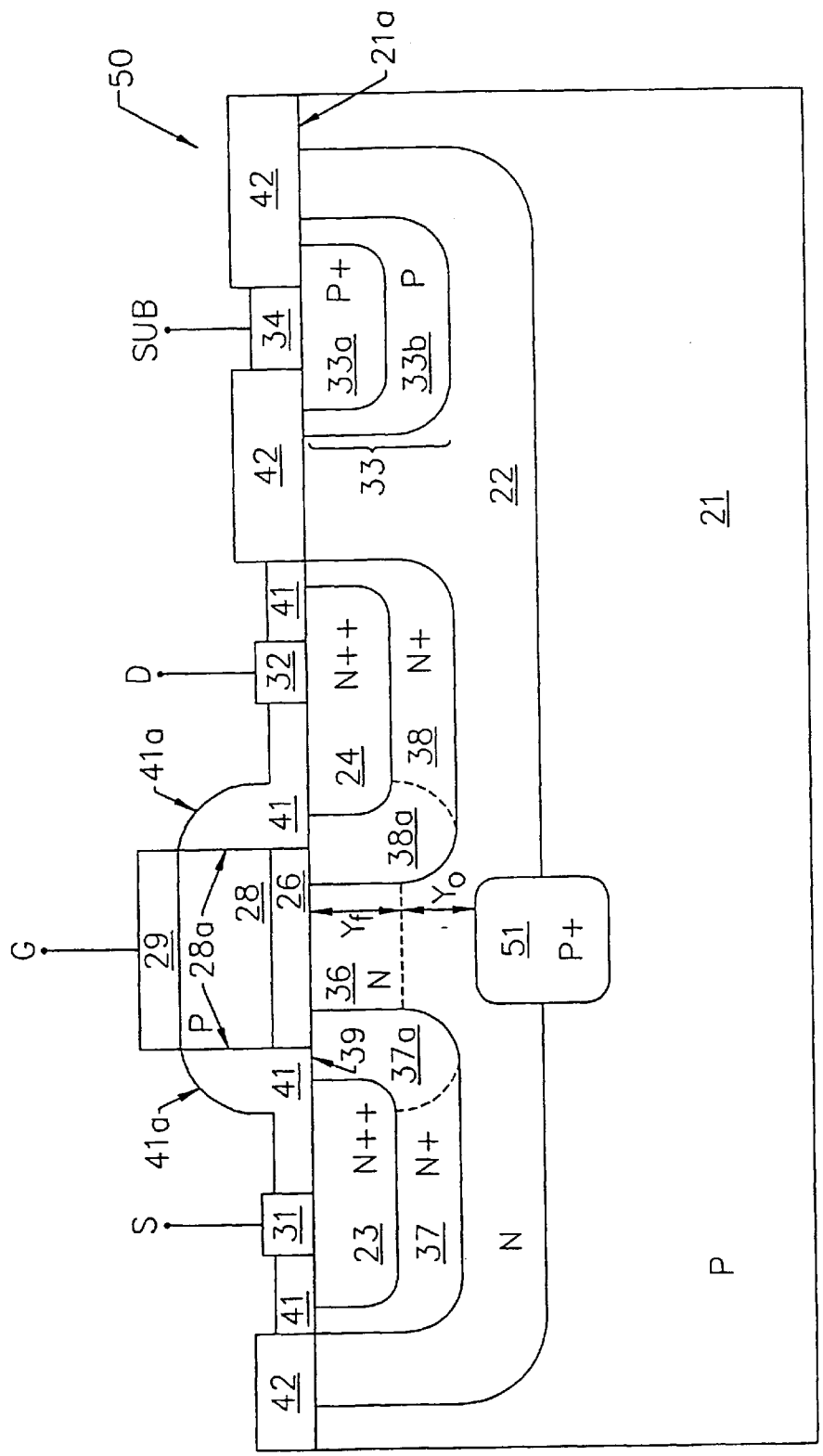
FIG. 2A illustrates a cross-sectional view of a first embodiment of a short channel low leakage current Fermi-FET according to U.S. Pat. No. 5,374,836.
Figure 2B:
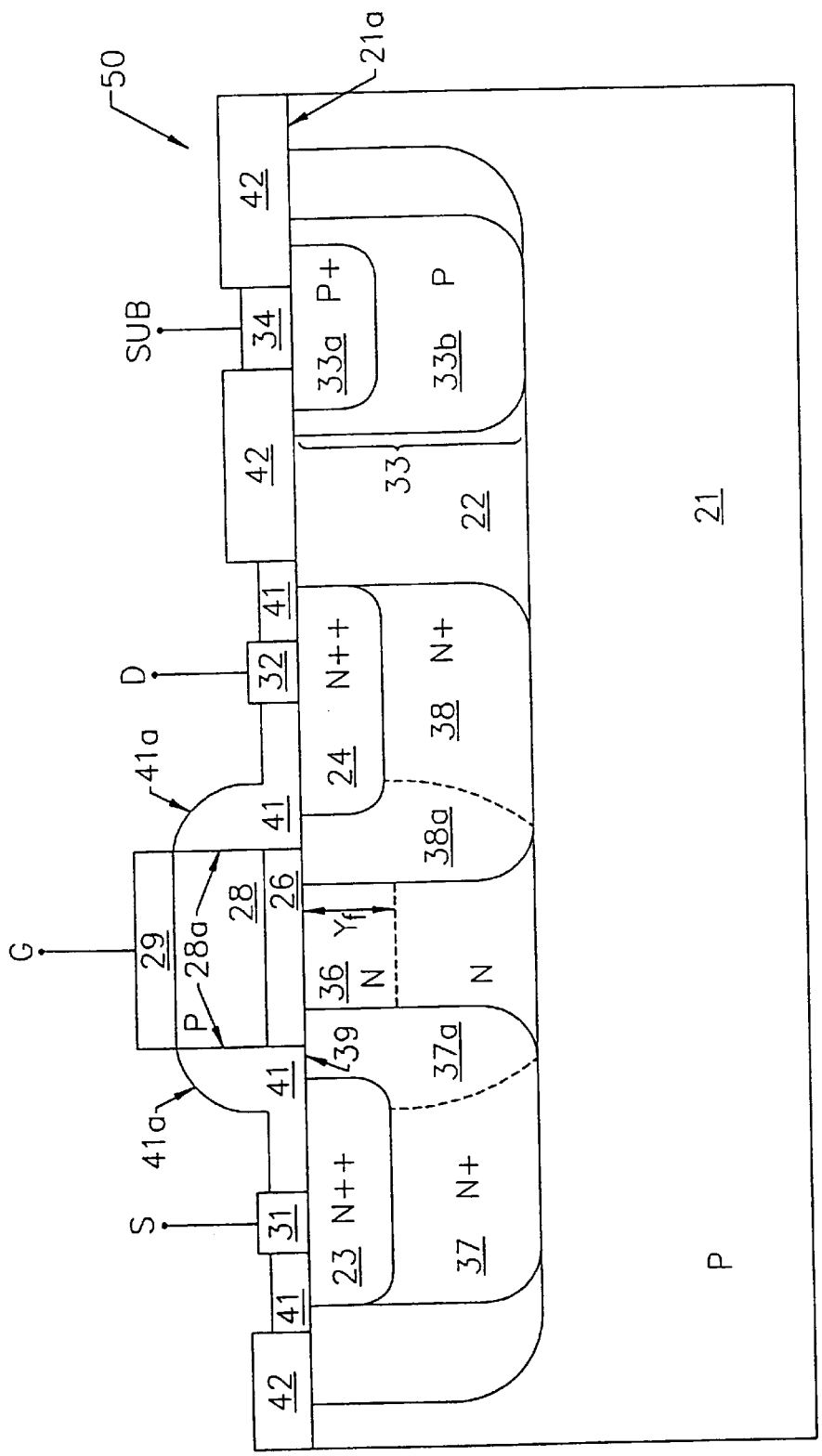
FIG. 2B illustrates a cross-sectional view of a second embodiment of a short channel low leakage current Fermi-FET according to U.S. Pat. No. 5,374,836.

Referring now to FIGS. 2A and 2B, Fermi-FETs which have short channels yet produce low leakage current, according to U.S. Pat. No. 5,374,836 will now be described. These devices will hereinafter be referred to as "low leakage current Fermi-FETs". The low leakage current Fermi-FET 50 of FIG. 2A includes a bottom leakage current control region 51 of first conductivity type, here P conductivity type, and doped at a high concentration relative to the substrate 21. Accordingly, it is designated as $P^+$ in FIG. 2A. The low leakage current Fermi-FET 60 of FIG. 2B includes extended source and drain injector regions 37a, 38a, which preferably extend to the depth of the Fermi-tub 22.

Referring now to FIG. 2A, bottom leakage current control region 51 extends across the substrate 21 from between an extension of the facing ends of the source and drain regions 23 and 24, and extends into the substrate from above the depth of the Fermi-tub 22 to below the depth of the Fermi-tub. Preferably, it is located below, and in alignment with the Fermi-channel 36. For consistency with the equations previously described, the depth from the Fermi-channel 36 to the top of the bottom current leakage current control region 51 has been labeled $Y_O$. The remainder of the Fermi-FET transistor of FIG. 2A is identical with that described in FIG. 1, except that a shorter channel is illustrated. It will be understood by those having skill in the art that injector regions 37a and 38a and/or injector tubs 37 and 38 may be omitted, as may the gate sidewall spacer region 41, to provide a low leakage current low capacitance, short channel Fermi-FET without the high current properties of the device of FIG. 2A.

The bottom leakage current control region 51 minimizes drain induced injection in short channel Fermi field effect transistors, i.e. those field effect transistors having a channel length of approximately 0.5 μm or less, while maintaining low diffusion depletion capacitance. For example, at 5 volts, leakage current of 3E–13A or less may be maintained.

The bottom leakage current control region may be designed using Equations 2 and 3 where $Y_0$ is the depth from the channel to the top of the bottom leakage control region as shown in FIGS. 2A and 2B. Factor α is the ratio between the P+ doping of the bottom leakage current control region 51 and the N doping of the Fermi-tub 22. Preferably α is set to about 0.15 within the bottom leakage control region, i.e. below the gate 28. Below the source and drain regions 23 and 24, α is set to about 1.0 to minimize diffusion depletion capacitance. In other words, the doping concentrations of substrate 21 and Fermi-tub 22 are about equal in the regions below the source and drain. Accordingly, for the design parameters described above, and for a channel width of 0.5 micron, the doping concentration in the bottom leakage control region 51 is approximately 5E17 and is deep enough to support partial depletion at the tub-junction region given 5 volt drain or source diffusion potential.

Referring now to FIG. 2B, an alternate design for bottom leakage control extends the depth of source injector region 37a and drain injector region 38a, preferably to the depth of the Fermi-tub $(Y_f + Y_0)$. As shown in FIG. 2B, the depth of the entire source injector tub 37 and drain injector tub 38 may be extended, preferably to the depth of the Fermi-tub. The separation distance between the bottom of the injector tubs 37 and 38 and the bottom of the Fermi-tub 22 is preferably less than half the channel length and preferably approaches zero. Under these conditions, injector tubs 37 and 38 have doping concentration of about 1.5E18/cm³. The depth of substrate contact region 33b also preferably is extended to approach the Fermi-tub depth. The remainder of the Fermi-FET transistor 60 of FIG. 2B is identical with that described in FIG. 1, except that a shorter channel is illustrated.

Contoured-Tub Fermi-Threshold Field Effect Transistor

Figure 3:
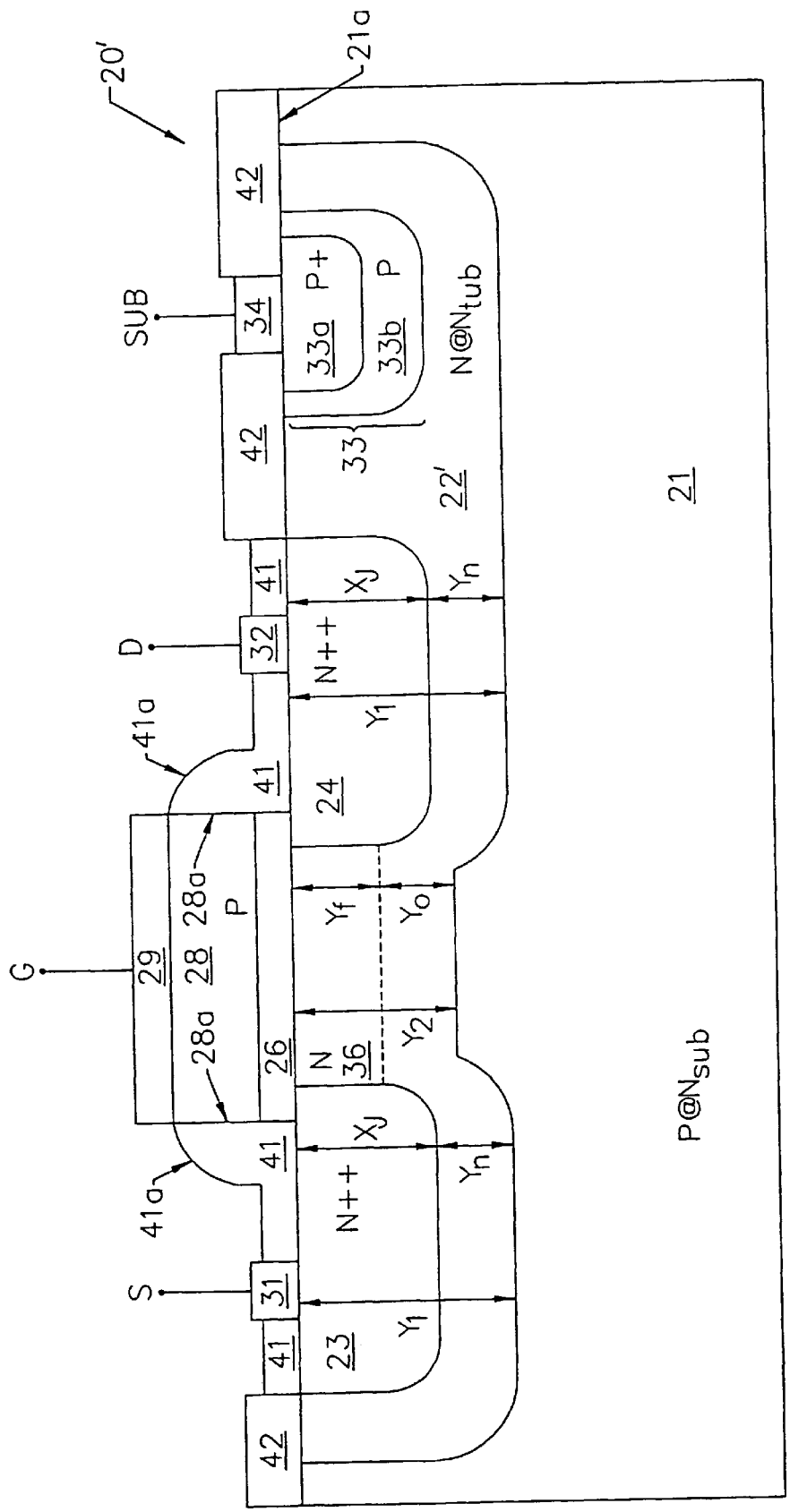
FIG. 3 illustrates a cross-sectional view of an N-channel contoured-tub Fermi-FET according to application Ser. No. 08/037,636.

Referring now to FIG. 3, an N-channel contoured-tub Fermi-FET according to application Ser. No. 08/037,636 is illustrated. It will be understood by those having skill in the art that a P-channel Fermi-FET may be obtained by reversing the conductivities of the N and P regions. As illustrated in FIG. 3, contoured-tub Fermi-FET 20' is similar to high current Fermi-FET 20 of FIG. 1, except that a contoured-tub 22' is present rather than the tub 22 of FIG. 1 which has a uniform tub depth. Injector tubs and injector regions are not shown, although they may be present.

Still referring to FIG. 3, contoured-tub 22' has a first predetermined depth $Y_1$ from the substrate face 21a to below at least one of the spaced-apart source and drain regions 23, 24 respectively. The contoured-tub 22' has a second predetermined depth $Y_2$ from the substrate face 21a to below the channel region 36. According to the invention, $Y_2$ is different from, and preferably less than, $Y_1$ so as to create a contoured-tub 22'. Stated another way, the junction between tub 22' and substrate 21 is pushed downward, away from source and drain regions 23 and 24, relative to the position dictated by the tub-FET criteria under the channel, to reduce the source/drain diffusion capacitance and thereby allow the contoured-tub Fermi-FET to operate at low voltages. It will be understood by those having skill in the art that tub 22' may only be contoured under source region 23 or drain region 24 to produce an asymmetric device. However, symmetric devices in which the tub is contoured under source 23 and drain 24 are preferably formed.

The second predetermined depth $Y_2$ is selected based on the low capacitance Fermi-FET (Tub-FET) criteria of U.S. Pat. Nos. 5,194,923 and 5,369,295. These criteria, which determine the depths $Y_f$ and $Y_0$, and which together form the second predetermined depth $Y_2$, are described above.

The first predetermined depth $(Y_1)$ is selected to be greater than the second predetermined depth $Y_2$. Preferably, the first predetermined depth is also selected to deplete the tub region 22' between the first predetermined depth $Y_1$ and the source and/or drain regions when zero voltage is applied to the source contact 31 and drain contact 32 respectively. Thus, the entire region labelled $Y_n$ is preferably totally depleted under zero source bias or drain bias respectively. Based on this criteria, $Y_1$ is determined by:

$$Y_n = \sqrt{\frac{kT}{q} \text{Ln}\left(\frac{N_{sub}N_{tub}}{n_i^2}\right) \frac{2\epsilon_s}{qN_{sub}} \frac{1}{\left(1 + \frac{N_{sub}}{N_{tub}}\right)}} \quad (4)$$

where $N_{sub}$ is the doping concentration of the substrate 21 and $N_{tub}$ is the doping concentration of the contoured-tub 22'.

Short Channel Considerations

The Fermi-FET designs of FIGS. 1–3 describe preferred designs for Fermi-FET transistor architecture for all channel lengths to produce high current, low leakage devices. These devices are preferably used at all linewidths. However, it will be understood by those having skill in the art that as devices are scaled to linewidths of substantially less than one micron, processing limitations, and the resultant electrical effects, may require a change in the device architecture in order to optimize the device, while still adhering to the basic Fermi-FET criteria. For example, as illustrated in FIGS. 1–3, the source and drain regions 23 and 24 respectively are in Fermi-tub 22 or 22', and the Fermi-tub completely surrounds the source and drain regions. However, as devices are scaled to channel lengths well below one micron, there is a need to make the depth of tub 22 substantially shallower than what would be predicted by U.S. Pat. No. 5,367,186 entitled Bounded Tub Fermi-FET to Albert W. Vinal and the present inventor, assigned to the assignee of the present invention, the disclosure of which is hereby incorporated herein by reference. The tub should be made shallower due to the increased contribution of drain induced barrier lowering at the source.

Unfortunately, in the present state of integrated circuit manufacturing, it may be difficult to reduce the tub depth and correspondingly decrease the source and drain depths so that the source and drain are in the tub and completely surrounded by the tub. In particular, the source and drain depths may be limited by, among other things, the thermal budget of the manufacturing process after the source and drain regions are formed, the diffusivity of the dopant species utilized and/or the amount of diffusion-enhancing crystalline defects present or formed when diffusions are created or activated.

Due to these processing limitations, the Fermi-tub depth will eventually approach the source and drain depths. It is also possible for the Fermi-tub depth to be shallower than the source and drain regions for extremely short channel lengths or deep diffusion depths. In order to allow for these processing conditions, while still satisfying the Fermi-FET criteria for high performance, the short channel Fermi-FET of the present invention is provided. However, it will be understood that in order to maintain maximum performance, the architecture of FIGS. 1–3 should preferably be used. In particular, in order to produce the highest performance device at small linewidths, attempts should be made to create a surrounding tub using low thermal budgets, slow moving dopants and/or other processing techniques, so that the source and drain regions are completely within the tub whenever possible.

Design of a Short Channel Fermi-FET

Figure 4:
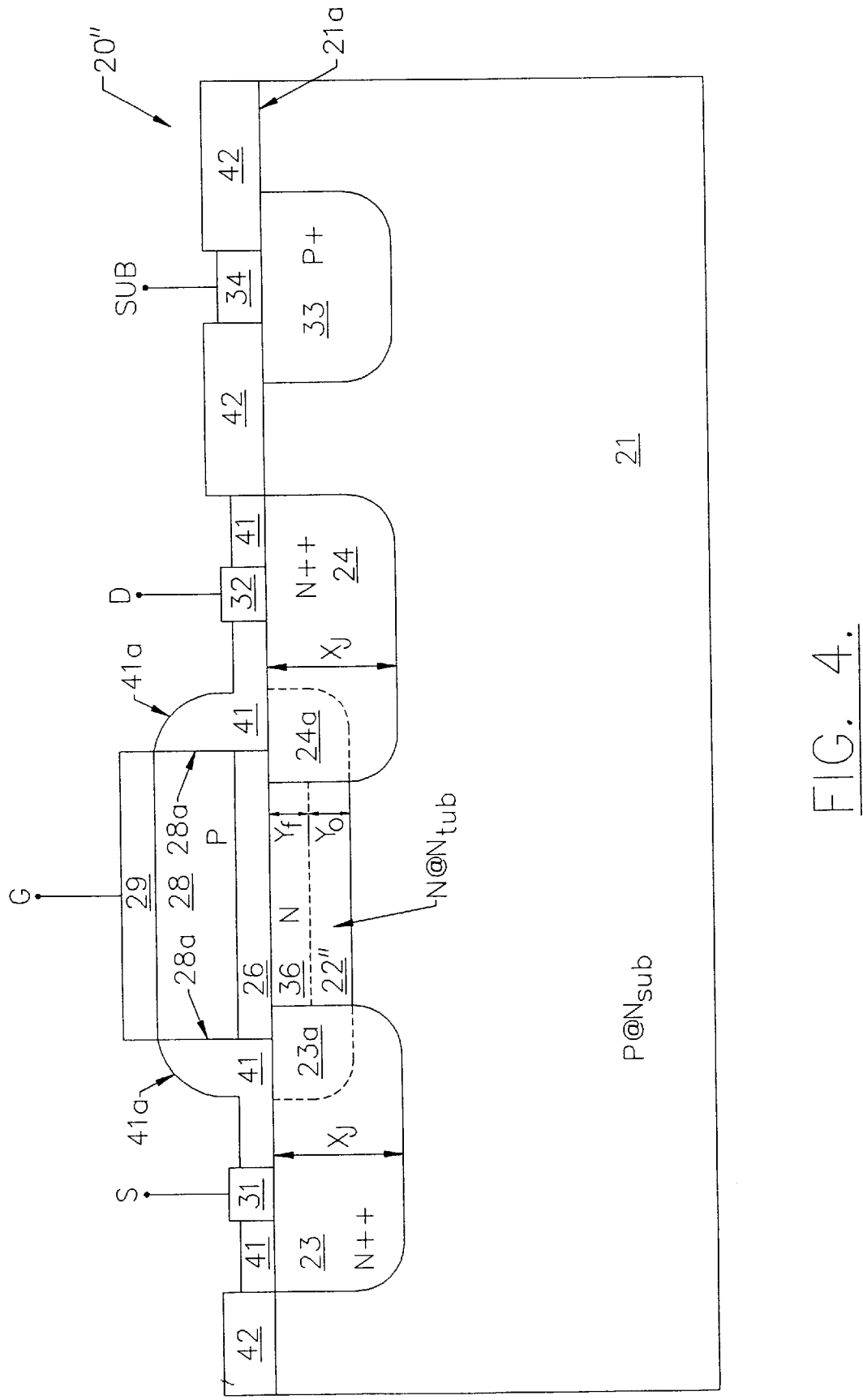
FIG. 4 illustrates a cross-sectional view of an N-channel short channel Fermi-FET according to the present invention.

Referring now to FIG. 4, a short channel N-channel Fermi-FET 20'' according to the invention is illustrated. It will be understood by those having skill in the art that a P-channel short channel Fermi-FET may be obtained by reversing the conductivities of the N and P regions. As shown in FIG. 4, Fermi-tub 22'' extends a first depth ($Y_f+Y_0$) from the substrate surface 21a. The spaced-apart source and drain regions 23 and 24 respectively are located in the tub region, as shown by regions 23a and 24a. However, the source and drain regions 23 and 24 respectively also extend from the substrate surface 21a to beyond the tub depth. Source and drain regions 23 and 24 also extend laterally in a direction along substrate surface 21a, to beyond the tub region.

The channel depth $Y_f$ and the tub depth from the channel $Y_0$ are selected to minimize the static electric field perpendicular to the substrate surface in the channel 36 from the substrate surface to the depth $Y_f$ when the gate electrode is at threshold potential. As already described, these depths are also preferably selected to produce a threshold voltage for the field effect transistor which is twice the Fermi potential of the semiconductor substrate 21. These depths are also selected to allow carriers of the second conductivity type to flow from the source region to the drain region in the channel region, extending from the depth $Y^f$ toward the substrate surface 21a upon application of voltage to the gate electrode beyond the threshold voltage of the field effect transistor. Carriers flow within the channel region from the source region to the drain region underneath the substrate surface without creating an inversion layer in the channel. Accordingly, while not optimum, the device of FIG. 4 can still produce saturation currents far higher than traditional MOSFET transistors, with significant reductions in off-state gate capacitance. Drain capacitance becomes similar to standard MOSFET devices.

It will be understood that in FIG. 4, the source and drain regions extend beyond the tub region in the depth direction orthogonal to substrate face 21a, and also in the lateral direction parallel to substrate face 21a. However, in order to decrease the parasitic sidewall capacitance, the tub 22'' preferably extends laterally beyond the source and drain regions, so that the source and drain regions only project through the tub in the depth direction.

Figure 5:
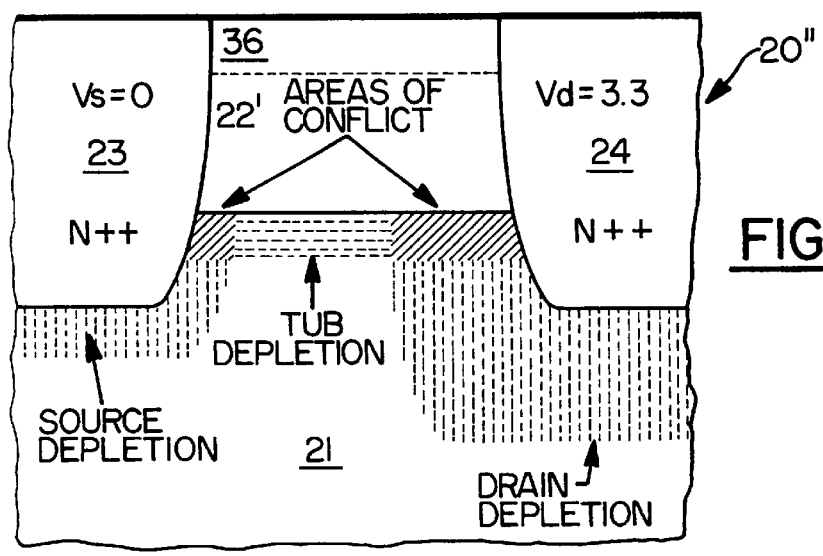
FIG. 5 illustrates a cross-sectional view of charge sharing conditions in the transistor of FIG. 4.

When process limitations produce a short channel Fermi-FET as shown in FIG. 4, adjustments can be made to the substrate concentration to compensate for the junction between the source/drain regions and the substrate. The additional junction causes a parasitic depletion of the well region leading to a "charge sharing" condition as shown in FIG. 5. The charge sharing causes a reduction in the effective well doping below the Fermi-tub. The depletion regions of the source and drain regions reduce the effective tub doping of the device due to charge sharing. This also produces an increased threshold sensitivity to drain potential.

This type of charge sharing is responsible for the well known "short channel effect" seen in conventional MOSFET devices. In Fermi-FET devices, this effect may lead to a degeneration in sub-threshold slope and higher Idss rather than simply a reduction in threshold normally associated with this phenomenon in conventional MOSFET devices.

Fermi-FET transistors according to FIG. 1 include a depleted region below the junction between tub 22 and substrate 21. The width of the depleted region in the substrate 21 is:

$$W_{sub} = \sqrt{\frac{2\epsilon_s V_{bi}}{qN_{tub}}\left(\frac{N_{sub}}{N_{sub}+N_{tub}}\right)} \quad (5)$$

where $$V_{bi} = \frac{kT}{q}\operatorname{Ln}\left(\frac{N_{tub}}{N_{sub}}\right)$$

This depleted region contains ionized atoms ($\#_{dep}$) equal to the average concentration ($N_{sub}$) times the area depleted ($W_{sub}L_{eff}$):

$$\#_{dep} = N_{sub}W_{sub}L_{eff} \quad (6)$$

Referring again to FIG. 4, in the case of a projecting source and drain regions, the source and drain regions utilize some of this available charge due to the junction between the source/drain and substrate 21, which has a finite width parallel to the junction between the tub 22'' and substrate 21. Some of the available charge is lost due to the built-in junction potential as in Equation 5, and additional charge is lost due to the potential applied to the drain region by $V_d$.

Assuming that the penetration of the source and drain regions below the tub 22'' is large compared to the drawn channel length $L_O$ then the shared charge in the channel $\#_{shared}$ is equal to:

$$\#_{shared} = N_{sub}W_{sub}(W_{source}+W_{drain}) \quad (7A)$$

where $$W_{source} = \sqrt{\frac{2\epsilon_s N^+ \phi_b}{qN_{sub}(N_{sub}+N^+)}} \quad (7B)$$

and $$W_{drain} = \sqrt{\frac{2\epsilon_s N^+ \phi_b + V_{dd}}{qN_{sub}(N_{sub}+N^+)}}$$

$$\phi_b = \frac{kT}{q}\operatorname{Ln}\left(\frac{N^+}{N_{sub}}\right). \quad (7C)$$

This implies that an increase to the substrate concentration should be made for the effective concentration to produce the minimum vertical field condition at $V_t$:

$$N^*_{sub} = N_{sub}\left[\frac{\#_{dep}+\#_{shared}}{\#_{dep}}\right] \quad (8)$$

Due to the variation in the shared charge with $V_d$, there is a greater threshold variation with $V_d$ in a device constructed according to FIG. 4 as well. Accordingly, optimum performance will generally be obtained with a device conforming to FIG. 1 or 2. However, as extremely short channels are produced, the tub depth will become short enough to cause the source and drain regions to extend beyond the tub as illustrated in FIG. 4, even with slow diffusing dopants, such as arsenic and indium. It can be seen that the shared charge is a function of the ratio of the depth of the source/drain regions $X_j$, to the tub depth $Y_f+Y_0$.

Short Channel Fermi-FET with Source and Drain Extension Regions

Figure 6:
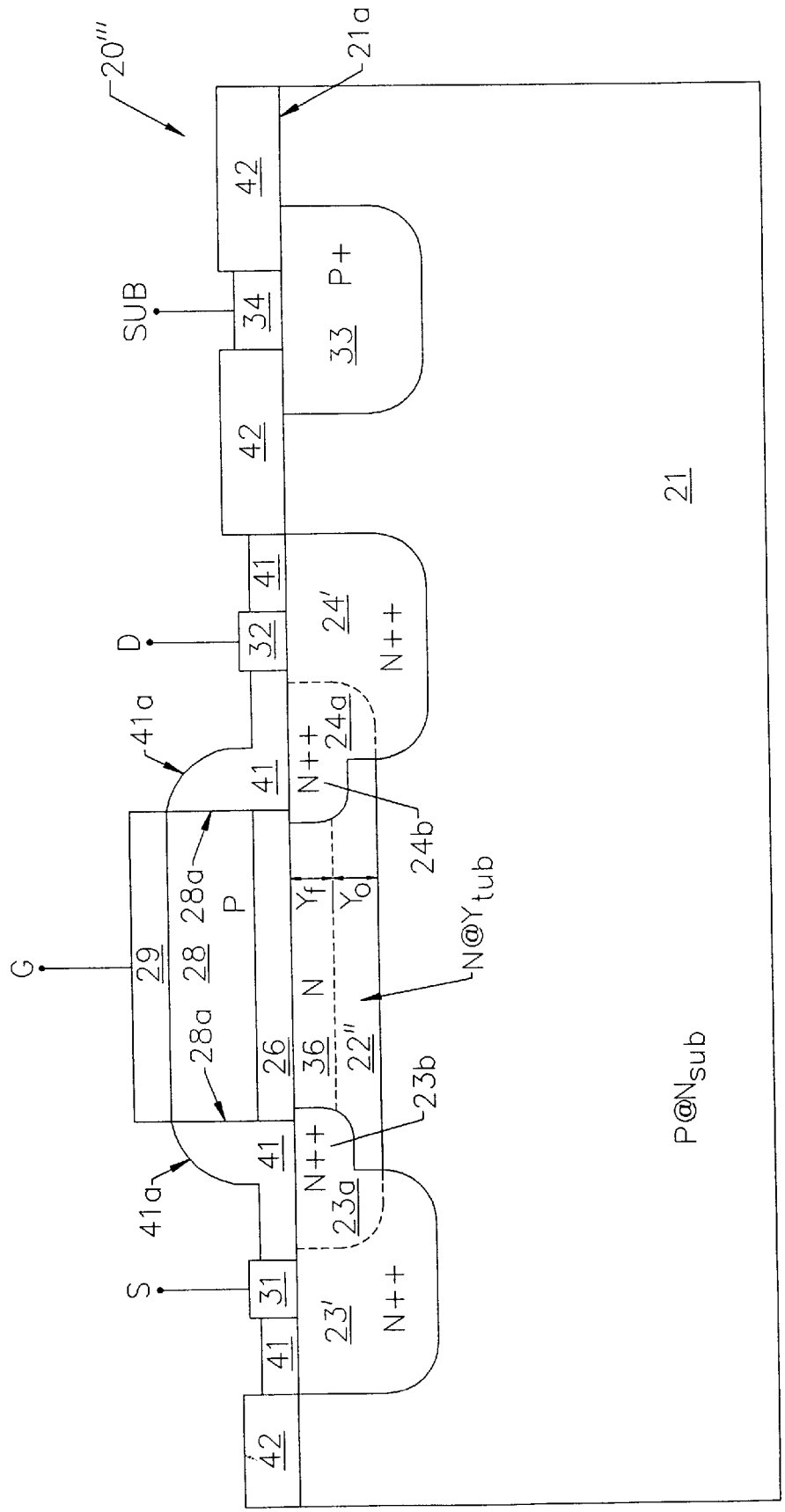
FIG. 6 illustrates a cross-sectional view of a second embodiment of an N-channel short channel Fermi-FET according to the present invention.

Referring now to FIG. 6, a second embodiment of a short channel Fermi-FET according to the present invention is illustrated. Transistor 20''' is similar to transistor 20'' of FIG. 4 except that source and drain extension regions 23b and 24b respectively are provided in the substrate 21 at the substrate face 21a adjacent the source region and drain regions 23' and 24' respectively, extending into channel 36.

As shown in FIG. 6, source and drain extension regions 23b and 24b respectively are heavily doped (N++), at approximately the same doping concentration as source and drain regions 23' and 24'. It will be understood that the extensions 23b and 24b are not lightly doped as are lightly doped drain structures of conventional MOSFET devices. Rather, they are doped at the same doping concentration as the source and drain region, and are preferably as highly doped as practical in order to reduce leakage and improve saturation current.

The source and drain extension regions 23b and 24b reduce drain voltage sensitivity due to the charge sharing described above. Unfortunately, the device of FIG. 6 will generally not display as low a capacitance as the fully enclosed source and drain regions of FIGS. 1 and 2. It will be understood by those having skill in the art that in order to preserve the dimensions of the source/drain extension regions 23b and 24b, a heavy, slow moving dopant such as arsenic or indium is preferably used for the source and drain extension regions rather than a lighter, faster moving element which is typically used for the source and drain regions themselves. The source and drain extension regions may be formed by using a wide spacer 41a to define the lateral dimensions of the extension regions and to move the deep source/drain diffusions outward at least to the depth defined by $W_{drain}$ in Equation 7B.

Short channel Fermi-FET transistors are also subject to drain induced barrier lowering, DIBL. In a Fermi-FET, DIBL leads to two separate fields: Drain Field Threshold Lowering (DFTL) which is a field from the drain electrode to the gate electrode, and Drain Induced Injection (DII) which is drain field acting on the source electrode.

Figure 7:
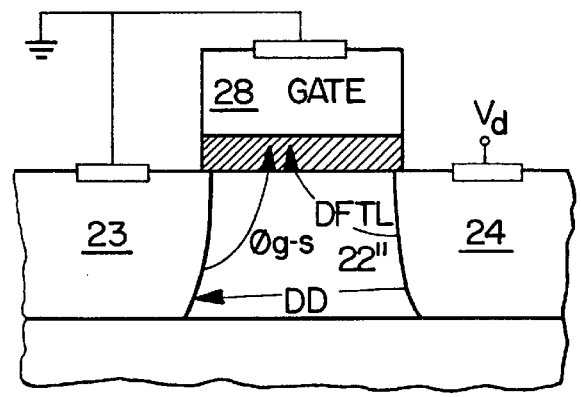
FIG. 7 illustrates a cross-sectional view of electric fields in the short channel field effect transistor of FIG. 4 when the device is in the off-state.

Counteracting these two fields are the built-in barrier of the N+:N source junction (assuming an N-channel transistor) and the difference in contact potential between the gate and source electrodes. FIG. 7 depicts these three fields. DFTL is present due to the difference in the gate and drain potential. DII is the field present between the drain and source diffusions. $\epsilon_{g-s}$ is due to the difference in contact potentials of the gate and source electrodes.

Figure 8A:
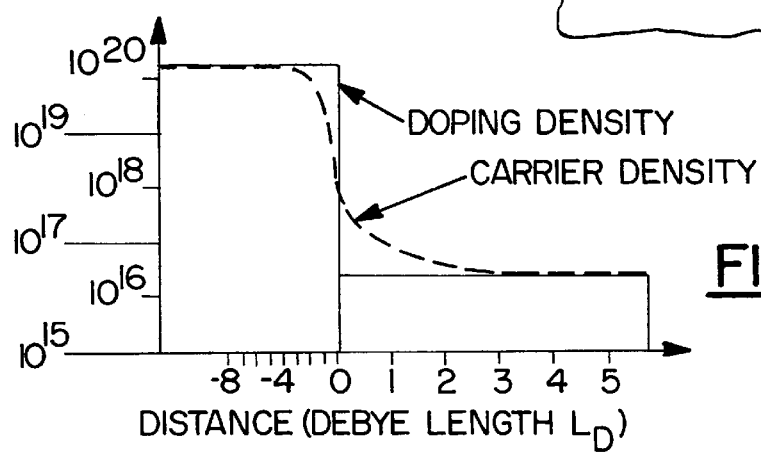
FIGS. 8A and 8B graphically illustrate an idealized doping profile and carrier profile, and the resultant electric field respectively, for an $N^+:N^-$ junction.
Figure 8B:
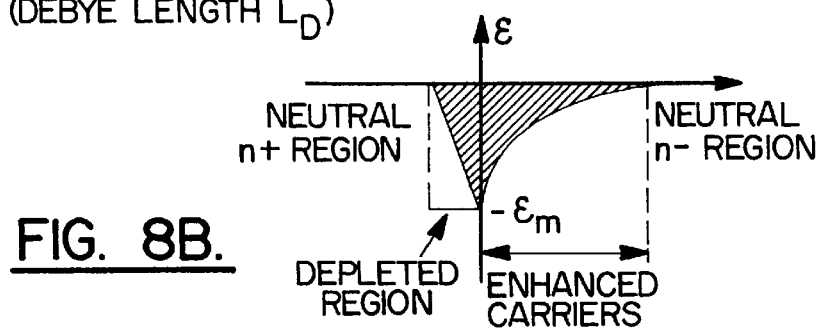

FIGS. 8A and 8B illustrate the behavior of the source/drain:tub (N+:N or P+:P) junction. Due to the high dopant gradient at the junction edge, carriers diffuse across the junction from the highly doped side to the lightly doped side. FIG. 8A shows the idealized doping profile and the resultant carrier profile after mobile charge moves from the highly doped to the lightly doped regions. As shown in FIG. 8B, the resulting depleted region on the highly doped side and free carriers at the edge of the lightly doped region create a retarding field to prevent further carrier migration. A source carrier must then overcome this potential barrier in order to reach the channel and become a conduction charge. The energy barrier at a high doped:low doped junction can be expressed as a potential $V_j$:

$$V_j = \frac{kT}{q} \text{Ln}\left(\frac{N^+}{N^-}\right) \quad (9)$$

Figure 9:
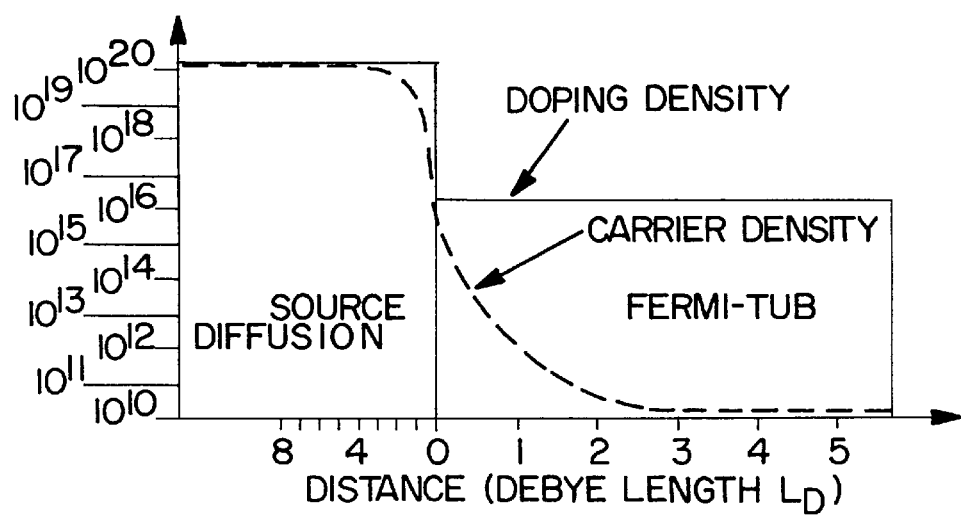
FIG. 9 graphically illustrates the $N^+:N^-$ junction of a tub-FET between the source region and the Fermi-tub.

In a Fermi-FET however, the channel region is fully depleted when the device is turned off due to the effect of the tub:substrate junction. The channel side of the N+:N junction thus appears to be doped at the intrinsic level. Carriers that cross the junction to set-up the barrier potential will first occupy the sites on the ionized donor atoms (lowest energy state available) producing a distribution as seen in FIG. 9. The barrier potential for the Fermi-FET ($V_{jff}$) is significantly higher than the doping levels involved would otherwise produce. Thus, Equation 9 can be modified to:

$$V_{jff} = \frac{kT}{q} \text{Ln}\left(\frac{N^+}{n_i}\right) \quad (10)$$

Assuming that the tub doping level in an N-Channel Fermi-FET is $2 \times 10^{16}$, the fact that the channel is fully depleted raises the energy barrier from 0.228 eV to 0.590 eV, over 200%. This change in the barrier height permits short channel Fermi-FET devices to be constructed with reasonable leakage values provided that adjustments are made for DIBL.

This barrier energy acts across a distance equal to the depleted region in the source region, plus the enhanced region within the channel. Utilizing the depletion approximation to calculate the width of the N+ side, and assuming the accumulation region occupies 2.5 Debye lengths ($L_D$), the charged region width $W_{d+e}$ can be expressed as:

$$W_{d+e} = \sqrt{\frac{\epsilon_s kT}{q^2 N^+} \text{Ln}\left(\frac{N^+}{n_i}\right)} + 2.5 \sqrt{\frac{\epsilon_s kT}{q^2 N_{tub}}} \quad (11)$$

Although if unbounded, an electron distribution of 2 to 3 Debye lengths is reasonable for the dipole, transistor linewidths are a more constraining factor. Assuming that the tub doping is $n_i$, then 2.5 $L_D$ is over 10 μM. This is larger than the available channel length. The barrier potential must then be applied across the available channel width, which leads to an effective field strength $\epsilon_{jff}$ of:

$$\epsilon_{jff} = \frac{\frac{kT}{q} \text{Ln}\left(\frac{N^+}{n_i}\right)}{\sqrt{\frac{\epsilon_s kT}{q^2 N^+} \text{Ln}\left(\frac{N^+}{n_i}\right)} + L_{eff}} \quad (12)$$

Referring again to FIG. 7, it can be seen that leakage of the Fermi-FET will be negatively affected by DII and positively affected by $\epsilon_{g-s}$ and the energy barrier in Equation 10. The strength of the DII field is a function of $V_d$ and $L_{eff}$:

$$\epsilon_{DII} = \frac{V_d}{L_{eff}} \quad (13)$$

The strength of the $\epsilon_{g-s}$ field is a function of the distance from the bottom of the gate electrode. $\epsilon_{g-s}$ decreases as the distance from the interface increases. It is weakest at the bottom of the diffusion, or at the bottom of the Fermi-tub, whichever is shallower. Thus, $$\epsilon_{g-s} = \frac{\frac{kT}{q} \text{Ln}\left(\frac{N^+ N_{poly}}{n_i^2}\right)}{\frac{\epsilon_s}{\epsilon_i} T_{ox} + Y(x)} \quad (14)$$

where Y(x) is the depth below interface from the substrate surface 21a to a depth of $Y_f+Y_0$. Elevated leakage will begin to occur when the drain field exceeds the gate field plus the injection barrier:

$$\epsilon_{DII} \leq \epsilon_{jff} + \epsilon_{g-s} \quad (15)$$

Substituting Equations 12, 13 and 14 into Equation 15 yields:

$$\frac{V_d}{L_{eff}} \leq \frac{\frac{kT}{q} \text{Ln}\left(\frac{N^+}{n_i}\right)}{\sqrt{\frac{\epsilon_s kT}{q^2 N^+} \text{Ln}\left(\frac{N^+}{n_i}\right)} + L_{eff}} + \qquad (16)$$

$$\frac{\frac{kT}{q} \text{Ln}\left(\frac{N^+ N_{poly}}{n_i^2}\right)}{\frac{\epsilon_s}{\epsilon_i} T_{ox} + Y_T}$$

where $Y_T$ is the tub depth, $Y_f + Y_0$. Replacing the inequality and solving for $Y_T$ produces an equation which specifies a maximum limit for either $X_J$ or $Y_T$ (whichever is smaller) based upon $V_d$, $N^+$, $N_{poly}$, $L_{eff}$ and $T_{ox}$:

$$Y_T = Y_f + Y_0 = V_{g-s}\left(\frac{L_{eff} + L_D}{V_d - V_{jff} + \frac{L_D V_d}{L_{eff}}}\right) - \frac{\epsilon_s}{\epsilon_i} T_{ox} \qquad (17)$$

where $L_D$ is the Debye Length and $V_{g-s} = kT/q \text{ Ln}(N^+ N_{poly}/n_i^2)$ is the work function difference between the gate and source electrodes.

Equation 17 can be recast to express the total field at the weakest point of the source to tub boundary, at maximum depth $Y_T$. This total field is the sum of the three component fields:

$$\text{Field} = \frac{\frac{kT}{q} \text{Ln}\left(\frac{N^+}{n_i}\right)}{\sqrt{\frac{\epsilon_s kT}{q^2 N^+} \text{Ln}\left(\frac{N^+}{n_i}\right)} + L_{eff}} + \qquad (18)$$

$$\frac{\frac{kT}{q} \text{Ln}\left(\frac{N^+ N_{poly}}{n_i^2}\right)}{\frac{\epsilon_s}{\epsilon_i} T_{ox} + Y_T} - \frac{V_d}{L_{eff}}$$

As long as the sum of $\epsilon_{jff}$ and $\epsilon_{g-s}$ are larger than $\epsilon_{DII}$ the bottom leakage will not be inordinately affected by the drain bias. If the total field is negative however, the zero gate bias current will be increased due to the drain field. This condition leads to leakage becoming a strong function of process induced variations, which is generally more difficult to control. Therefore this condition of zero total field can be utilized to define a maximum advisable Fermi-tub depth for various transistor attributes. Since it is desirable to make the Fermi-Tub as deep as possible, Equation 17 generally defines the optimum Fermi-Tub depth for a short channel transistor.

Figure 10:
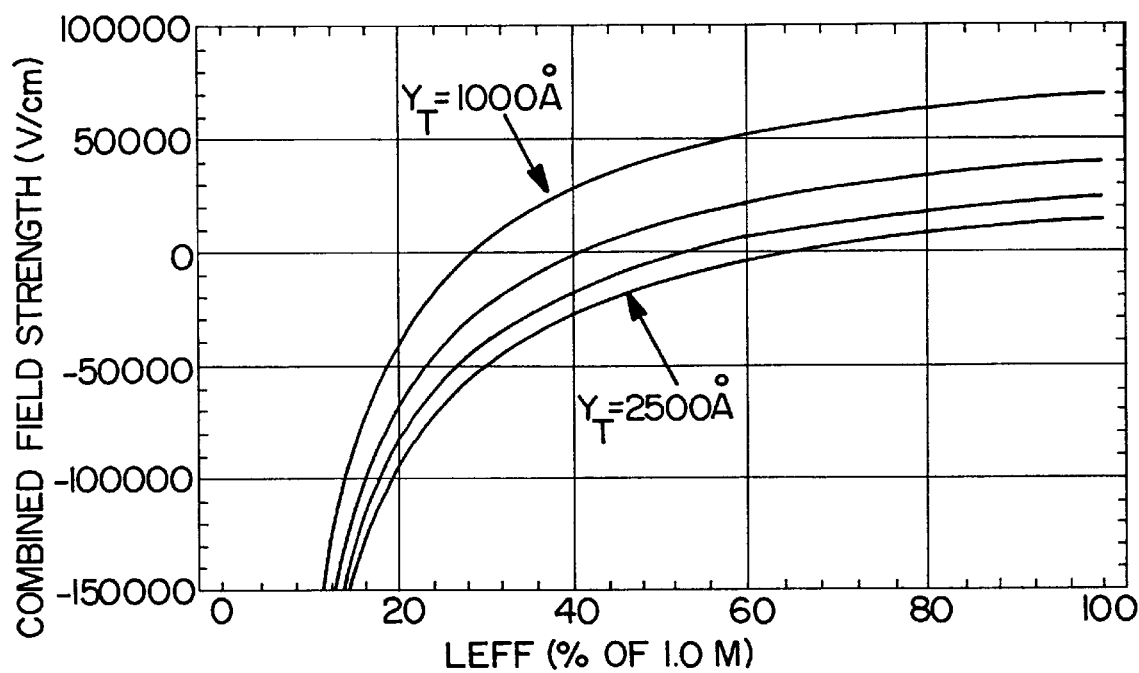
FIGS. 10–12 graphically illustrate combined field strength versus effective channel length for various combinations of tub depth and other device parameters.
Figure 11:
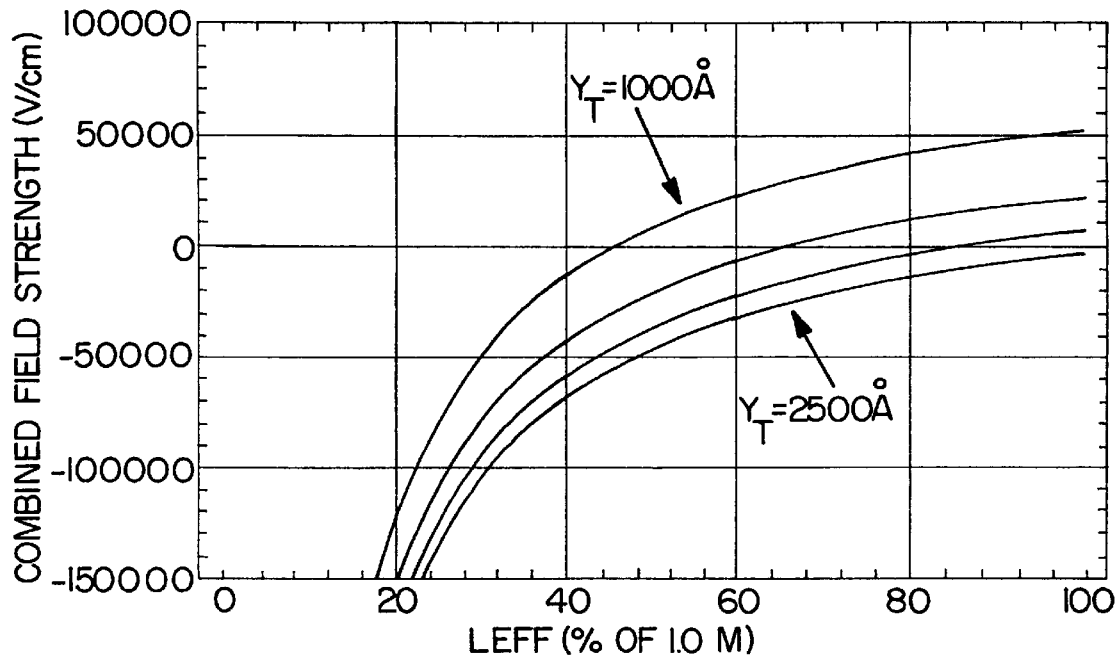

FIG. 10 illustrates the total field at the edge of the source near the tub:substrate junction. The curves represent tub depths of 1000 Å, 1500 Å, 2000 Å and 2500 Å, where $V_d$=3.3 V, $T_{ox}$=80 Å, $N_{tub}$=1×10$^{16}$, $N_{sub}$=5×10$^{16}$, $N^+$=1×10$^{20}$, β=0.72. Minimum $L_{eff}$ values can be extracted where each field strength crosses zero. For each of the four tub depths, minimum $L^{eff}$ is 0.28μ, 0.4μ, 0.52μ, and 0.64μ respectively. FIG. 11 illustrates the total field under the same conditions as FIG. 10, except that $V_d$ has been raised to 5.0 V. For each of the four tub depths, minimum $L_{eff}$ is 0.46μ, 0.65μ, 0.84μ, and 1.0μ respectively.

Figure 12:
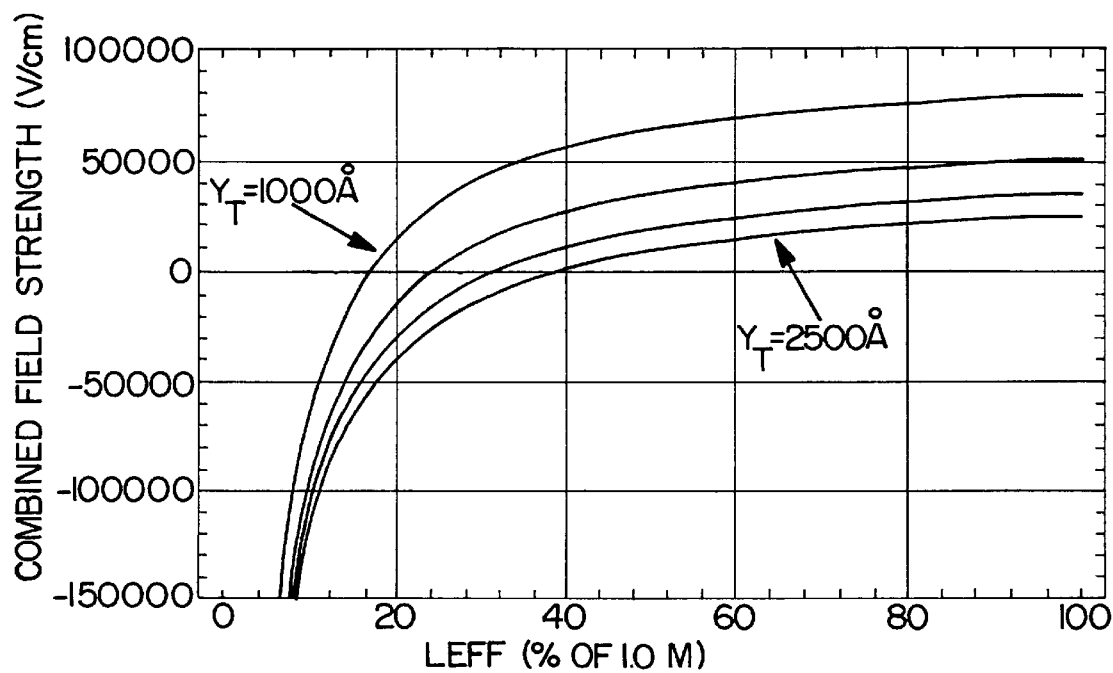

FIG. 12 illustrates the total field under the same conditions as FIG. 10, except that $V_d$ has been lowered to 2.2 V. For each of the four tub depths, minimum $L_{eff}$ is 0.16μ, 0.24μ, 0.32μ, and 0.39μ respectively.

Figure 13:
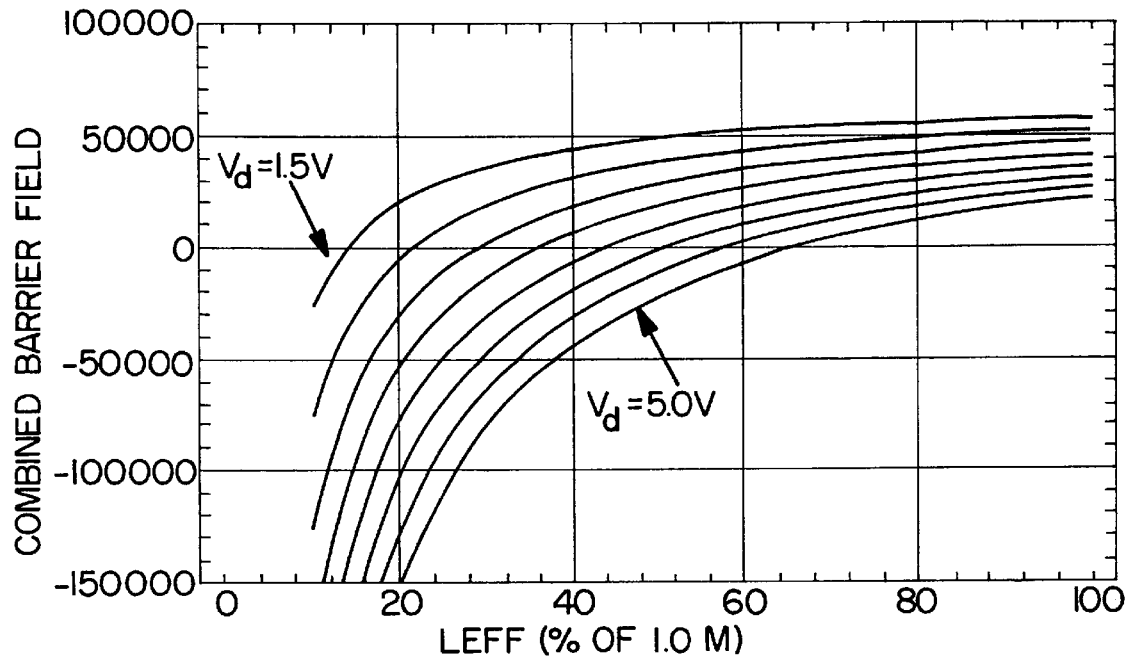
FIG. 13 graphically illustrates the combined barrier field versus effective channel length for various drain voltages.

FIG. 13 illustrates the tub depth being held fixed at 1500 Å, where $V_d$ is moved in 0.5 V steps from 1.5 V to 5.0 V.

Figure 14:
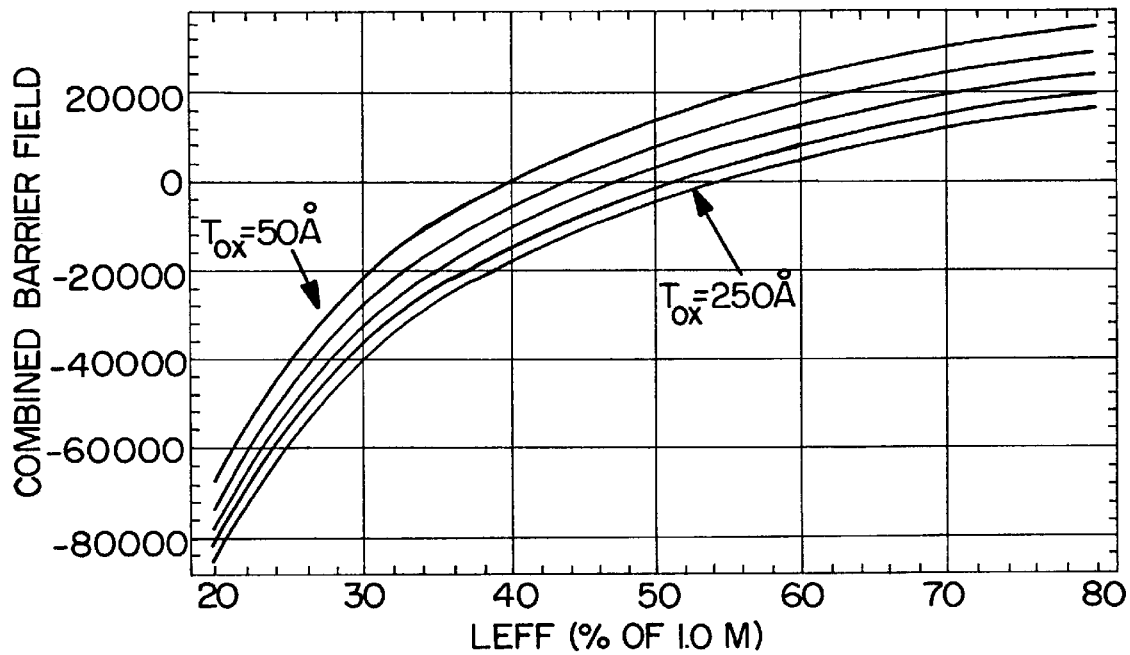
FIG. 14 graphically illustrates combined barrier field versus tub depth for various gate oxide thicknesses.

FIG. 14 illustrates the tub depth being held fixed at 1500 Å and $V_d$ at 3.3 V. Gate oxide thickness $T_{ox}$ is varied from 50 Å to 250 Å.

Contour-Tub Fermi-FET With Source and Drain Extension Regions

Figure 15:
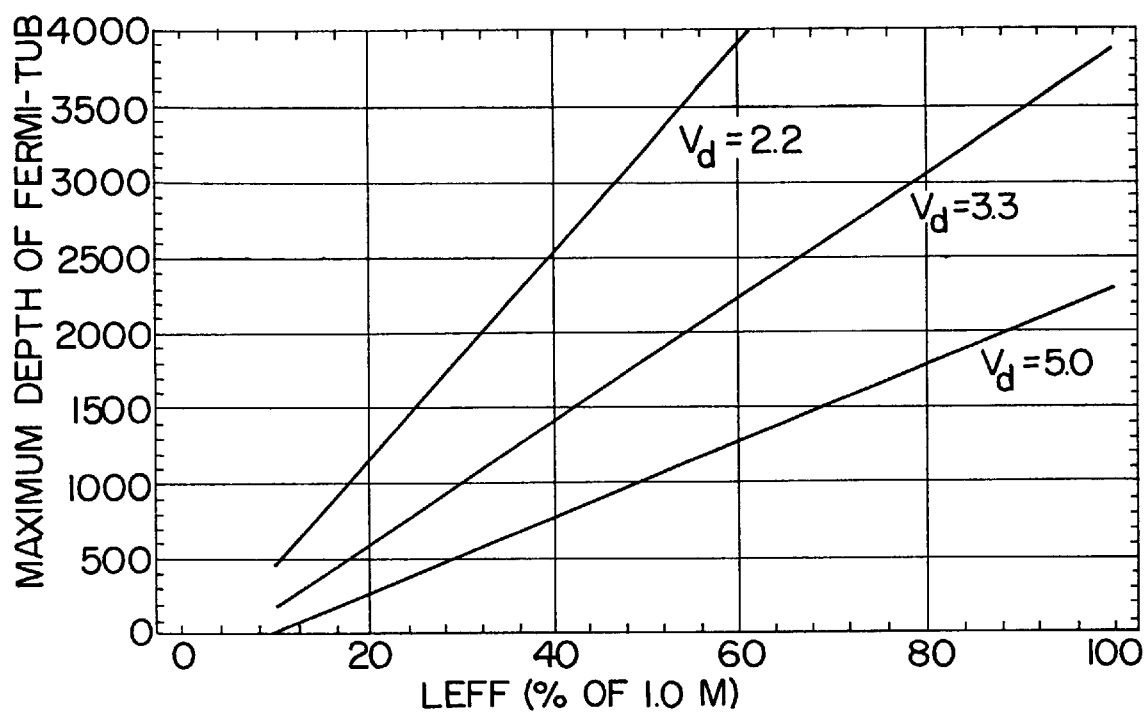
FIG. 15 graphically illustrates maximum depth of the Fermi-tub versus channel length for various drain voltages.

Plotting Equation 17 directly as a function of $L_{eff}$ shows an almost linear relationship. FIG. 15 illustrates the maximum Fermi-tub depth without drain field causing leakage instability. Accordingly, at the expense of additional process complexity, a Fermi-FET device can be created for short channel transistors without increasing diffusion capacitance. This device can be created by combing the source/drain extension regions of FIG. 6 with the contour-tub of application Ser. No. 08/037,636. This device thus includes a second deeper tub structure under the source and drain regions of the Fermi-FET transistor.

Figure 16:
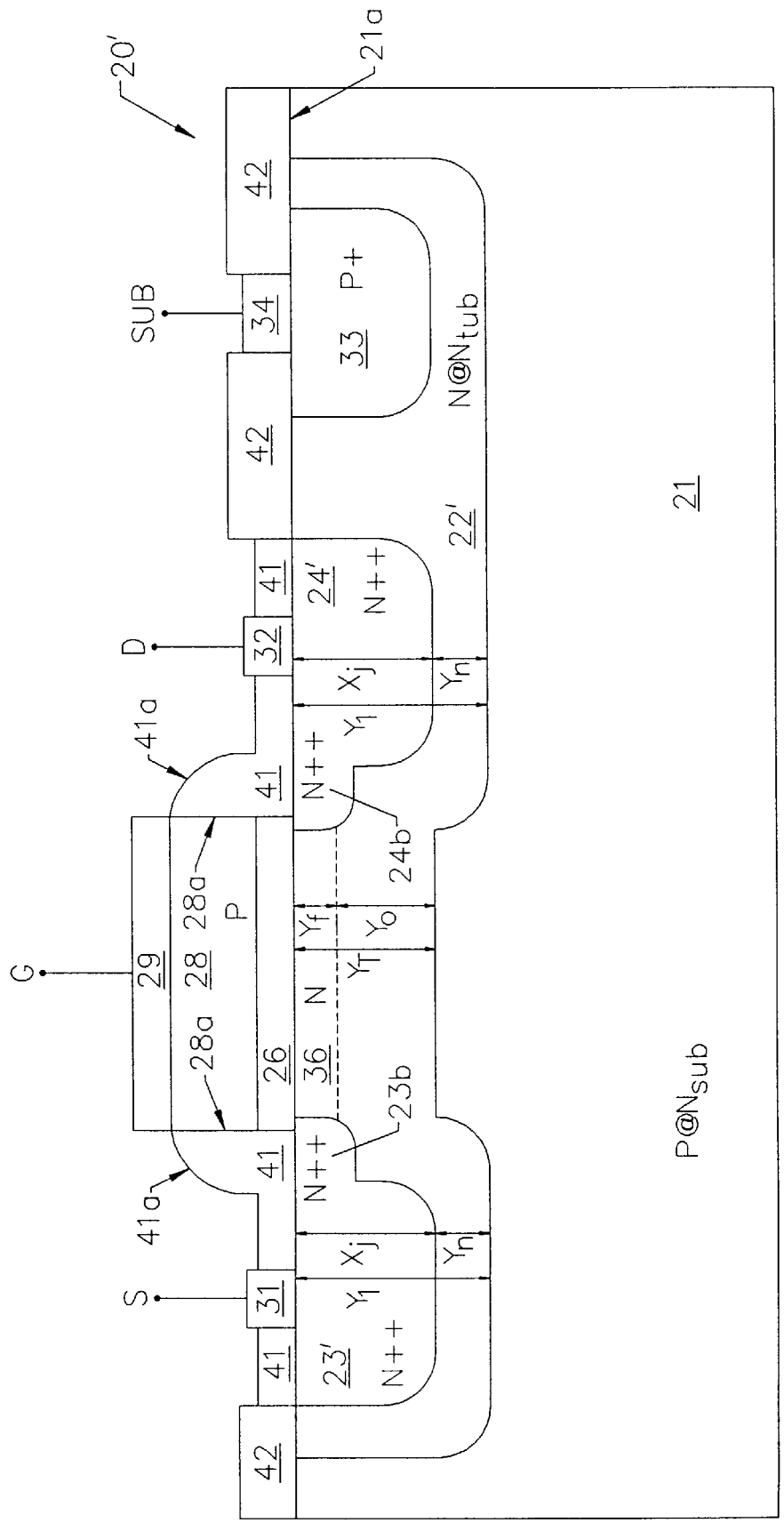
FIG. 16 illustrates a cross-sectional view of a contoured-tub Fermi-FET including source and drain extension regions according to the present invention.

Thus, as shown in FIG. 16, the contour-tub Fermi-FET includes source and drain extension regions 23b and 24b. The advantages of the contour-tub are thereby provided along with the advantages of the source and drain extension regions for short channel devices. The deeper tub creates a lowered capacitance for the source and drain regions even though they extend deeper than the tub depth between the source and drain regions.

A representative process for fabricating a contoured-tub Fermi-FET with source and drain extension regions as shown in FIG. 16 will now be described. In general, the deep section of the contoured-tub may be formed by an additional implantation step during the source and drain implant process, at an energy such that the tub-substrate junction is moved significantly away from the source/drain edges. These implants may also be referred to as "shadow implants". The additional implants may be performed after spacer etch, and prior to the source/drain implants.

Figure 17A:
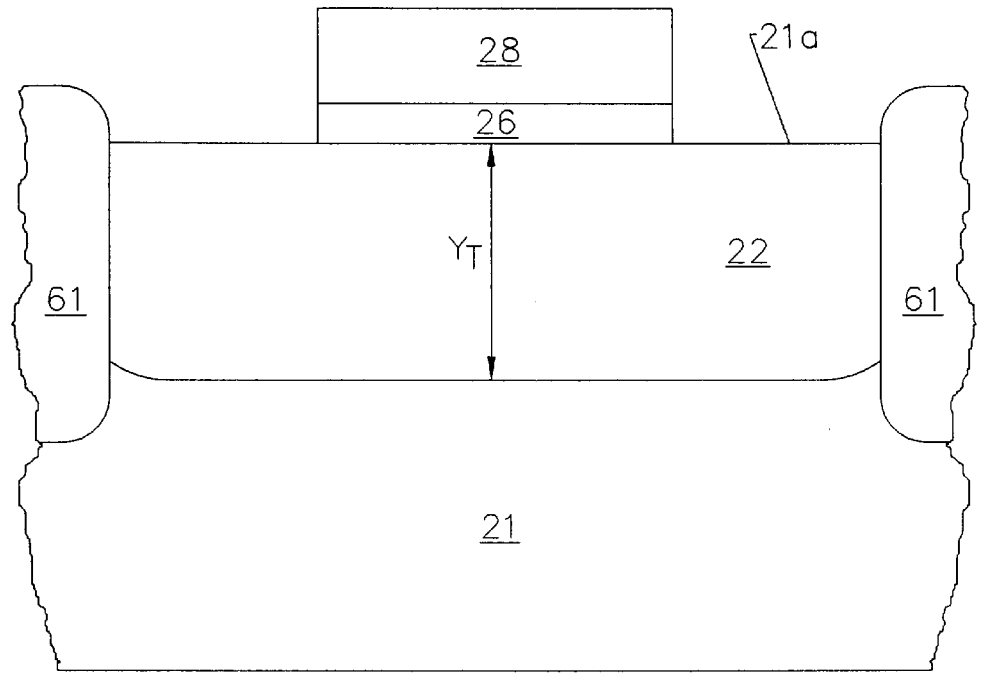
FIGS. 17A–17D illustrate cross-sectional views of the Fermi-FET of FIG. 16 during intermediate fabrication steps.

In particular, referring to FIG. 17A, a uniform depth tub 22 of first conductivity type is formed in semiconductor substrate 21 of second conductivity type. Tub 22 extends from face 21a of substrate 21 to a predetermined depth $Y_T$ from the substrate face 21a. Tub 22 is typically formed by implanting ions of the first conductivity type into the substrate at face 21a using field oxide 61 as a mask. After formation of tub 22, gate insulating layer 26 and gate electrode layer 28 are formed using conventional techniques.

Figure 17B:
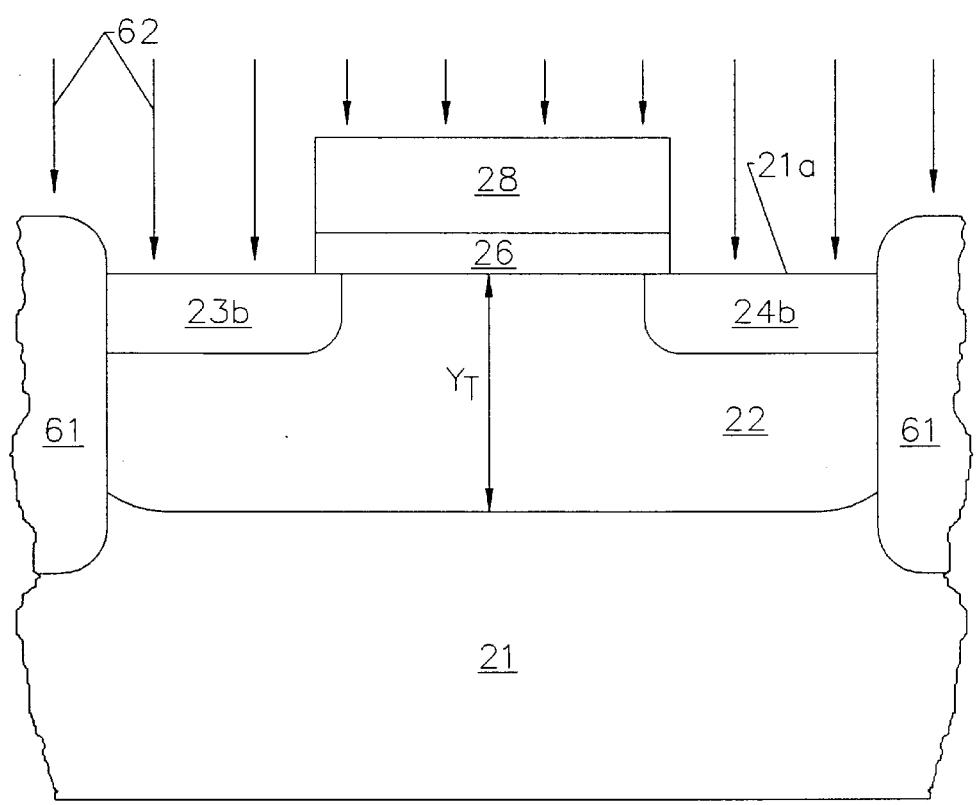

Referring now to FIG. 17B, first ions 62 of the first conductivity type are implanted to the substrate face 21a at a shallow depth corresponding to the depth of the source/drain extension regions 23b, 24b. As already described, heavy ions with low mobility such as arsenic and indium are used.

Figure 17C:
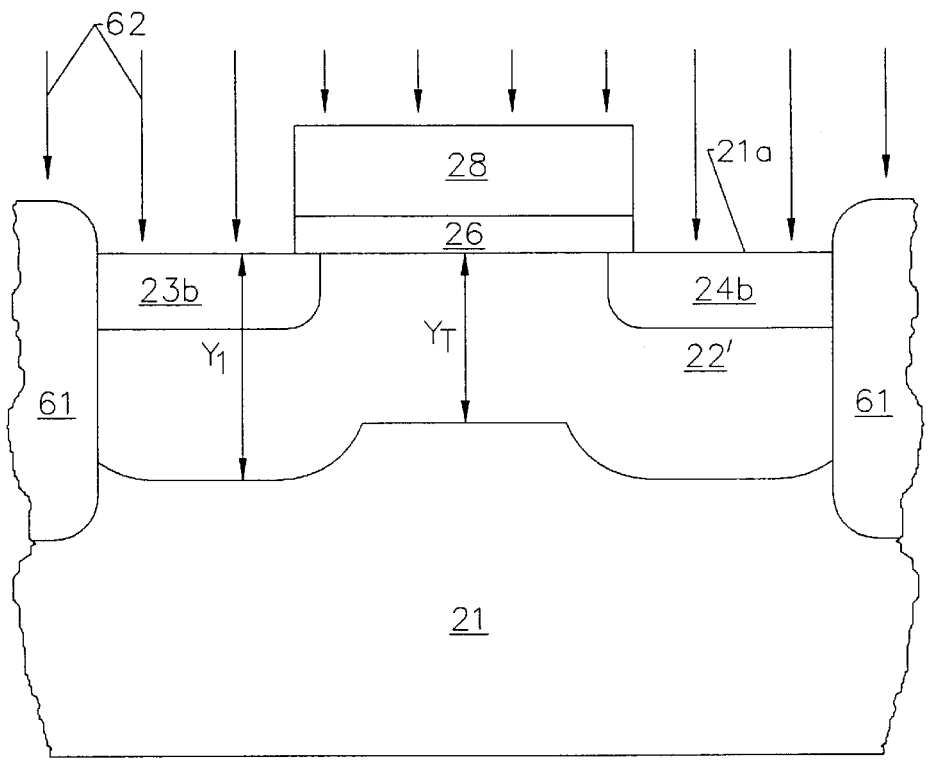

Referring now to FIG. 17C, second ions 63 of the first conductivity type are implanted into the substrate face 21a to a depth $Y_1$ which is greater than the depth $Y_T$. Gate 28 masks implantation of the first ions 62 into the substrate under the gate. Accordingly, the tub 22 and the first ions 62 form a contoured-tub 22' having nonuniform tub depth. Typically, first ions 62 are implanted at a low dose but relatively higher energy than the implant which formed tub 22.

Figure 17D:
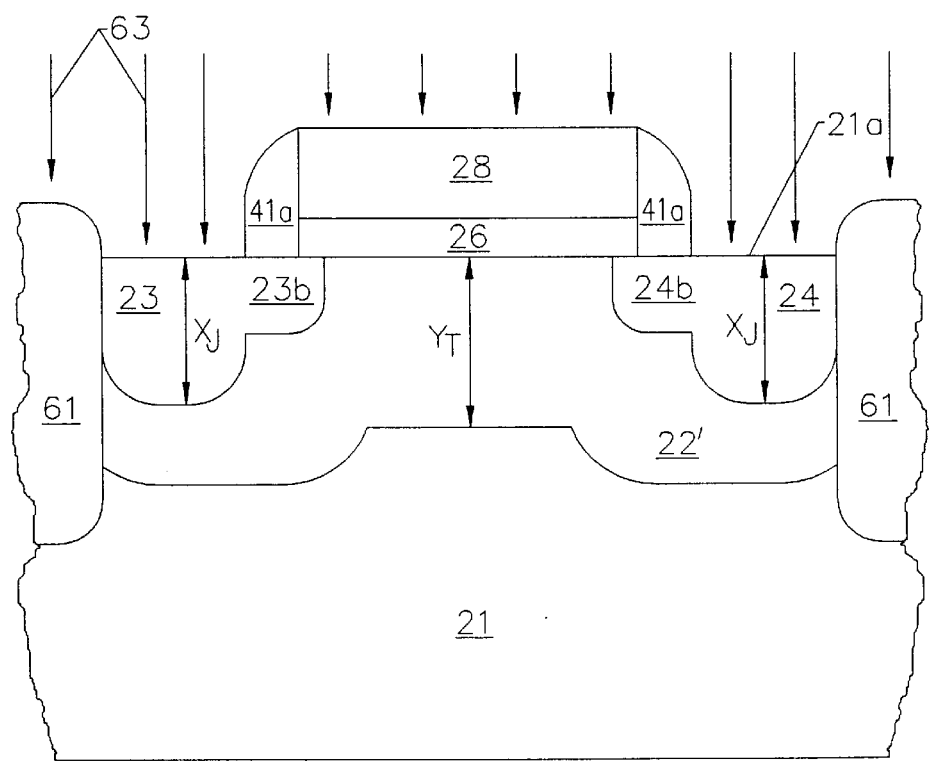

Referring now to FIG. 17D, sidewall spacers 419 are formed using conventional techniques. Second ions 64 of the first conductivity type are then implanted into the substrate face 21a. Gate 28 and sidewall spacers 419 mask implantation of the second ions into the substrate under the gate. Source and drain regions 23 are thereby formed at a depth $X_j$ from substrate face 21a. This implantation of second ions 63 is typically performed at a low dosage and a lower energy than the implant which formed tub 22. Conventional processing is then used to complete the transistor and form contacts to the transistor.

Design Procedure for Short-Channel Fermi-FET

In view of the above, the following design procedure may be employed to specify the parameters of a short-channel Fermi-FET. It will be understood that this procedure is presented as an example, and not for purposes of limitation.

It is assumed that the minimum transistor length is a known quantity as well as the gate insulator thickness and material and the maximum operating voltage $V_d$. It is further assumed that the anticipated depth of the diffused regions which will become the source and drain electrodes is known.

Those skilled in the art are able to select a minimum Fermi-tub dopant concentration that can be easily controlled given the equipment available for eventual manufacture and level of control expected for all relevant process steps.

The Fermi-tub depth and substrate doping is provided for long channel devices in U.S. Pat. No. 5,367,186 entitled Bounded Tub Fermi-FET and the earlier Tub-FET patents. The Fermi-tub depth should be modified per Equations 17 and 18 or FIGS. 10–12 and 15 of the present application.

If the resulting maximum tub depth is larger than the anticipated source and drain depth, the transistor should be constructed according to all earlier Tub-FET patents. If the transistor constraints lead to a shallow tub with respect to the diffusions, decisions should be made as to the desirability of utilizing drain extensions (as shown in FIG. 6 of the present application) contour tub structures, or both (as shown in FIG. 16 of the present application).

If the drain depth exceeds the tub depth and the additional process complexity of extensions or contour tub architectures are unwarranted, then the substrate concentration should be altered according to Equation 8 of the present application.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A field effect transistor comprising:

a semiconductor substrate of first conductivity type;

a tub region of second conductivity type in said substrate at a surface thereof, and extending a first depth from said substrate surface;

spaced apart source and drain regions of said second conductivity type in said tub region, said spaced apart source and drain regions extending from said substrate surface to beyond said first depth;

a channel region of said second conductivity type in said tub region, between said spaced apart source and drain regions, and extending a second depth from said substrate surface, wherein said second depth is less than said first depth,(at least one of said first and second depths being selected to minimize the static electric field perpendicular to said substrate surface,) from said substrate surface to said second depth;

a gate insulating layer on said substrate surface, between said spaced apart source and drain regions; and source, drain and gate electrodes contacting said source and drain regions and said gate insulating layer, respectively.

2. A field effect transistor according to claim 1 wherein said spaced apart source and drain regions further extend laterally away from one another, to beyond said tub region.

3. A field effect transistor according to claim 1 further comprising a source extension region in said substrate at said substrate face adjacent said source region and extending into said channel region, said source region and said source extension region being doped said second conductivity type at same doping concentration.

4. A field effect transistor according to claim 2 further comprising a drain extension region in said substrate at said substrate face adjacent said drain region and extending into said channel region, said drain region and said drain extension region being doped said second conductivity type at same doping concentration.

5. A field effect transistor comprising:

a semiconductor substrate of first conductivity type;

spaced apart source and drain regions of second conductivity type in said semiconductor substrate at a surface thereof;

a tub region of said second conductivity type in said substrate at a surface thereof, between said spaced apart source and drain regions, said tub region extending a first depth from said substrate surface, said source and drain regions extending into said substrate beyond said first depth;

a channel region of said second conductivity type in said tub region, between said spaced apart source and drain regions, and extending a second depth from said substrate surface, wherein said second depth is less than said first depth, at least one of said first and second depths being selected to minimize the static electric field perpendicular to said substrate surface, from said substrate surface to said second depth;

a gate insulating layer on said substrate surface, between said spaced apart source and drain regions; and source, drain and gate electrodes contacting said source and drain regions and said gate insulating layer, respectively.

6. A field effect transistor according to claim 5 further comprising a source extension region in said substrate at said substrate face adjacent said source region and extending toward said drain region, said source region and said source extension region being doped said second conductivity type at same doping concentration.

7. A field effect transistor according to claim 6 further comprising a drain extension region in said substrate at said substrate face adjacent said drain region and extending into said channel region, said drain region and said drain extension region being doped said second conductivity type at same doping concentration.

8. A field effect transistor comprising:

a semiconductor substrate of first conductivity type;

a tub region of second conductivity type in said substrate at a surface thereof, and extending a first depth from said substrate surface;

spaced apart source and drain regions of said second conductivity type in said tub region, said spaced apart source and drain regions extending from said substrate surface to beyond said first depth;

a channel region of said second conductivity type in said tub region, between said spaced apart source and drain regions, and extending a second depth from said substrate surface, wherein said second depth is less than said first depth, at least one of said first and second depths being selected to produce a threshold voltage for said field effect transistor which is twice the Fermi potential of said semiconductor substrate;

a gate insulating layer on said substrate surface, between said spaced apart source and drain regions; and source, drain and gate electrodes contacting said source and drain regions and said gate insulating layer, respectively.

9. A field effect transistor according to claim 8 wherein said spaced apart source and drain regions further extend laterally away from one another, to beyond said tub region.

10. A field effect transistor according to claim 8 further comprising a source extension region in said substrate at said substrate face adjacent said source region and extending into said channel region, said source region and said source extension region being doped said second conductivity type at same doping concentration.

11. A field effect transistor according to claim 10 further comprising a drain extension region in said substrate at said substrate face adjacent said drain region and extending into said channel region, said drain region and said drain extension region being doped said second conductivity type at same doping concentration.

12. A field effect transistor comprising:

a semiconductor substrate of first conductivity type;

spaced apart source and drain regions of second conductivity type in said semiconductor substrate at a surface thereof;

a tub region of said second conductivity type in said substrate at a surface thereof, between said spaced apart source and drain regions, said tub region extending a first depth from said substrate surface, said source and drain regions extending into said substrate beyond said first depth;

a channel region of said second conductivity type in said tub region, between said spaced apart source and drain regions, and extending a second depth from said substrate surface, wherein said second depth is less than said first depth, at least one of said first and second depths being selected to produce a threshold voltage for said field effect transistor which is twice the Fermi potential of said semiconductor substrate;

a gate insulating layer on said substrate surface, between said spaced apart source and drain regions; and source, drain and gate electrodes contacting said source and drain regions and said gate insulating layer, respectively.

13. A field effect transistor according to claim 12 further comprising a source extension region in said substrate at said substrate face adjacent said source region and extending toward said drain region, said source region and said source extension region being doped said second conductivity type at same doping concentration.

14. A field effect transistor according to claim 13 further comprising a drain extension region in said substrate at said substrate face adjacent said drain region and extending into said channel region, said drain region and said drain extension region being doped said second conductivity type at same doping concentration.

15. A field effect transistor comprising:

a semiconductor substrate of first conductivity type;

a tub region of second conductivity type in said substrate at a surface thereof, and extending a first depth from said substrate surface;

spaced apart source and drain regions of said second conductivity type in said tub region, said spaced apart source and drain regions extending from said substrate surface to beyond said first depth;

a channel region of said second conductivity type in said tub region, between said spaced apart source and drain regions, and extending a second depth from said substrate surface, wherein said second depth is less than said first depth;

a gate insulating layer on said substrate surface, between said spaced apart source and drain regions; and source, drain and gate electrodes contacting said source and drain regions and said gate insulating layer, respectively;

said first depth being selected to allow carriers of said second conductivity type to flow from said source region to said drain region in said channel region, at said second depth upon application of the threshold voltage of said field effect transistor to said gate electrode.

16. A field effect transistor according to claim 15 wherein said first depth is further selected to allow said carriers of said second conductivity type to flow from said source region to said drain region in said channel region, extending from said second depth towards said substrate surface upon application of voltage to said gate electrode beyond the threshold voltage of said field effect transistor.

17. A field effect transistor according to claim 15 wherein said spaced apart source and drain regions further extend laterally away from one another, to beyond said tub region.

18. A field effect transistor according to claim 15 further comprising a source extension region in said substrate at said substrate face adjacent said source region and extending into said channel region, said source region and said source extension region being doped said second conductivity type at same doping concentration.

19. A field effect transistor according to claim 18 further comprising a drain extension region in said substrate at said substrate face adjacent said drain region and extending into said channel region, said drain region and said drain extension region being doped said second conductivity type at same doping concentration.

20. A field effect transistor comprising:

a semiconductor substrate of first conductivity type;

spaced apart source and drain regions of second conductivity type in said semiconductor substrate at a surface thereof;

a tub region of said second conductivity type in said substrate at a surface thereof, between said spaced apart source and drain regions, said tub region extending a first depth from said substrate surface, said source and drain regions extending into said substrate beyond said first depth;

a channel region of said second conductivity type in said tub region, between said spaced apart source and drain regions, and extending a second depth from said substrate surface, wherein said second depth is less than said first depth;

a gate insulating layer on said substrate surface, between said spaced apart source and drain regions; and source, drain and gate electrodes contacting said source and drain regions and said gate insulating layer, respectively;

said first depth being selected to allow carriers of said second conductivity type to flow from said source region to said drain region in said channel region, at said second depth upon application of the threshold voltage of said field effect transistor to said gate electrode.

21. A field effect transistor according to claim 15 wherein said first depth is further selected to allow said carriers of said second conductivity type to flow from said source region to said drain region in said channel region, extending from said second depth towards said substrate surface upon application of voltage to said gate electrode beyond the threshold voltage of said field effect transistor.

22. A field effect transistor according to claim 20 further comprising a source extension region in said substrate at said substrate face adjacent said source region and extending toward said drain region, said source region and said source extension region being doped said second conductivity type at same doping concentration.

23. A field effect transistor according to claim 22 further comprising a drain extension region in said substrate at said substrate face adjacent said drain region and extending into said channel region, said drain region and said drain extension region being doped said second conductivity type at same doping concentration.

24. A field effect transistor comprising:
a semiconductor substrate of first conductivity type;
a tub region of second conductivity type in said substrate at a surface thereof, and extending a first depth from said substrate surface;
spaced apart source and drain regions of said second conductivity type in said tub region, said spaced apart source and drain regions extending from said substrate surface to beyond said first depth;
a channel region of said second conductivity type in said tub region, between said spaced apart source and drain regions, and extending a second depth from said substrate surface, wherein said second depth is less than said first depth, at least one of said first and second depths being selected to allow carriers of said second conductivity type to flow within said channel region, from said source region to said drain region and beneath said substrate surface, without creating an inversion layer in said channel;
a gate insulating layer on said substrate surface, between said spaced apart source and drain regions; and
source, drain and gate electrodes contacting said source and drain regions and said gate insulating layer, respectively.

25. A field effect transistor according to claim 24 wherein said spaced apart source and drain regions further extend laterally away from one another, to beyond said tub region.

26. A field effect transistor according to claim 24 further comprising a source extension region in said substrate at said substrate face adjacent said source region and extending into said channel region, said source region and said source extension region being doped said second conductivity type at same doping concentration.

27. A field effect transistor according to claim 26 further comprising a drain extension region in said substrate at said substrate face adjacent said drain region and extending into said channel region, said drain region and said drain extension region being doped said second conductivity type at same doping concentration.

28. A field effect transistor comprising:
a semiconductor substrate of first conductivity type;
spaced apart source and drain regions of second conductivity type in said semiconductor substrate at a surface thereof;
a tub region of said second conductivity type in said substrate at a surface thereof, between said spaced apart source and drain regions, said tub region extending a first depth from said substrate surface, said source and drain regions extending into said substrate beyond said first depth;
a channel region of said second conductivity type in said tub region, between said spaced apart source and drain regions, and extending a second depth from said substrate surface, wherein said second depth is less than said first depth, at least one of said first and second depths being selected to allow carriers of said second conductivity type to flow within said channel region, from said source region to said drain region and beneath said substrate surface, without creating an inversion layer in said channel;
a gate insulating layer on said substrate surface, between said spaced apart source and drain regions; and
source, drain and gate electrodes contacting said source and drain regions and said gate insulating layer, respectively.

29. A field effect transistor according to claim 28 further comprising a source extension region in said substrate at said substrate face adjacent said source region and extending toward said drain region, said source region and said source extension region being doped said second conductivity type at same doping concentration.

30. A field effect transistor according to claim 29 further comprising a drain extension region in said substrate at said substrate face adjacent said drain region and extending into said channel region, said drain region and said drain extension region being doped said second conductivity type at same doping concentration.

31. A field effect transistor comprising:
a semiconductor substrate of first conductivity type having an intrinsic carrier concentration $n_i$ at temperature T degrees Kelvin and a permittivity $\epsilon_s$;
a tub region of second conductivity type in said substrate at a surface thereof, and extending a first depth $V_T$ from said substrate surface;
spaced apart source and drain regions of said second conductivity type in said tub region, said spaced apart source and drain regions extending from said substrate surface to beyond said first depth and being doped at a doping concentration $N^+$;
a channel region of said second conductivity type in said tub region, between said spaced apart source and drain regions, having an effective channel length $L_{eff}$ and extending a second depth from said substrate surface, wherein said second depth is less than said first depth;
a gate insulating layer on said substrate surface, between said spaced apart source and drain regions, and having a thickness $T_{ox}$ and permittivity $\epsilon_i$; and
source, drain and gate electrodes contacting said source and drain regions and said gate insulating layer, respectively, said gate electrode including a polysilicon layer which is doped said first conductivity type at a doping concentration $N_{poly}$;
said first depth $Y_T$ being less than or equal to $$V_{g-s} \left( \frac{L_{eff} + L_D}{V_d - V_{jff} + \frac{L_D V_d}{L_{eff}}} \right) - \frac{\epsilon_s}{\epsilon_i} T_{ox}$$

where $V_{g-s}$ is the work function difference between said gate and source electrodes and is equal to $kT/q \, Ln \, (N^+ N_{poly}/n_i^2)$, where $V_{jff}$ is the barrier potential for the Fermi-FET and is equal to $kT/q \, Ln(N^+ n_i)$, where $V_d$ is the voltage applied to the drain electrode, q is 1.6×10$^{-19}$ coulomb and K is 1.38×10$^{-23}$ Joules/°Kelvin.

32. A field effect transistor according to claim 31 wherein Y$_T$ is equal to $$V_{g-s}\left(\frac{L_{eff}+L_D}{V_d-V_{jff}+\frac{L_DV_d}{L_{eff}}}\right)-\frac{\epsilon_s}{\epsilon_i}T_{ox}$$

where V$_{g-s}$ is the work function difference between said gate and source electrodes and is equal to kT/q Ln(N$^+$N$_{poly}$/n$_i^2$), where V$_{jff}$ is the barrier potential for the Fermi-FET and is equal to kT/q Ln(N$^+$/n$_i$), where V$_d$ is the voltage applied to the drain electrode, q is 1.6×10$^{-19}$ coulomb and K is 1.38×10$^{-23}$ Joules/°Kelvin.

33. A field effect transistor according to claim 31 wherein said spaced apart source and drain regions further extend laterally away from one another, to beyond said tub region.

34. A field effect transistor according to claim 31 further comprising a source extension region in said substrate at said substrate face adjacent said source region and extending into said channel region, said source region and said source extension region being doped said second conductivity type at same doping concentration.

35. A field effect transistor according to claim 34 further comprising a drain extension region in said substrate at said substrate face adjacent said drain region and extending into said channel region, said drain region and said drain extension region being doped said second conductivity type at same doping concentration.

36. A field effect transistor comprising:
a semiconductor substrate of first conductivity type having an intrinsic carrier concentration n$_i$ at temperature T degrees Kelvin and a permittivity $\epsilon_s$;
spaced apart source and drain regions of second conductivity type in said semiconductor substrate at a surface thereof;
a tub region of said second conductivity type in said substrate at a surface thereof, between said spaced apart source and drain regions, said tub region extending a first depth from said substrate surface, said source and drain regions extending into said substrate beyond said first depth and being doped at a doping concentration N$^+$;
a channel region of said second conductivity type in said tub region, between said spaced apart source and drain regions, having an effective channel length L$_{eff}$ and extending a second depth from said substrate surface, wherein said second depth is less than said first depth;
a gate insulating layer on said substrate surface, between said spaced apart source and drain regions and having a thickness T$_{ox}$ and permittivity $\epsilon_i$; and
source, drain and gate electrodes contacting said source and drain regions and said gate insulating layer, respectively, said first depth Y$_T$ being less than or equal to $$V_{g-s}\left(\frac{L_{eff}+L_D}{V_d-V_{jff}+\frac{L_DV_d}{L_{eff}}}\right)-\frac{\epsilon_s}{\epsilon_i}T_{ox}$$

where V$_{g-s}$ is the work function difference between said gate and source electrodes and is equal to kT/q Ln(N$^+$N$_{poly}$/n$_i^2$), where V$_{jff}$ is the barrier potential for the Fermi-FET and is equal to kT/q Ln(N$^+$/n$_i$), where V$_d$ is the voltage applied to the drain electrode, q is 1.6×10$^{-19}$ coulomb and K is 1.38×10$^{-23}$ Joules/°Kelvin.

37. A field effect transistor according to claim 36 wherein Y$_T$ is equal to $$V_{g-s}\left(\frac{L_{eff}+L_D}{V_d-V_{jff}+\frac{L_DV_d}{L_{eff}}}\right)-\frac{\epsilon_s}{\epsilon_i}T_{ox}$$

where V$_{g-s}$ is the work function difference between said gate and source electrodes and is equal to kT/q Ln(N$^+$N$_{poly}$/n$_i^2$), where V$_{jff}$ is the barrier potential for the Fermi-FET and is equal to kT/q Ln(N$^+$/n$_i$), where V$_d$ is the voltage applied to the drain electrode, q is 1.6×10$^{-19}$ coulomb and K is 1.38–10$^{×23}$ Joules/°Kelvin.

38. A field effect transistor according to claim 36 further comprising a source extension region in said substrate at said substrate face adjacent said source region and extending toward said drain region, said source region and said source extension region being doped said second conductivity type at same doping concentration.

39. A field effect transistor according to claim 38 further comprising a drain extension region in said substrate at said substrate face adjacent said drain region and extending into said channel region, said drain region and said drain extension region being doped said second conductivity type at same doping concentration.

40. A field effect transistor comprising:
a semiconductor substrate of first conductivity type;
a tub region of second conductivity type in said substrate at a surface thereof, and extending a first depth from said substrate surface;
spaced apart source and drain regions of said second conductivity type in said tub region, said spaced apart source and drain regions extending from said substrate surface to beyond said first depth;
a channel region of said second conductivity type in said tub region, between said spaced apart source and drain regions, and extending a second depth from said substrate surface, wherein said second depth is less than said first depth;
a gate insulating layer on said substrate surface, between said spaced apart source and drain regions;
source, drain and gate electrodes contacting said source and drain regions and said gate insulating layer, respectively; and
a source extension region in said substrate at said substrate face adjacent said source region and extending into said channel region, said source region and said source extension region being doped said second conductivity type at same doping concentration.

41. A field effect transistor according to claim 40 further comprising a drain extension region in said substrate at said substrate face adjacent said drain region and extending into said channel region, said drain region and said drain extension region being doped said second conductivity type at same doping concentration.

42. A field effect transistor according to claim 40 wherein said spaced apart source and drain regions further extend laterally away from one another, to beyond said tub region.

43. A field effect transistor comprising:
a semiconductor substrate of first conductivity type;
spaced apart source and drain regions of second conductivity type in said semiconductor substrate at a surface thereof;
a tub region of said second conductivity type in said substrate at a surface thereof, between said spaced apart source and drain regions, said tub region extending a first depth from said substrate surface, said source and drain regions extending into said substrate beyond said first depth;

a channel region of said second conductivity type in said tub region, between said spaced apart source and drain regions, and extending a second depth from said substrate surface, wherein said second depth is less than said first depth;

a gate insulating layer on said substrate surface, between said spaced apart source and drain regions;

source, drain and gate electrodes contacting said source and drain regions and said gate insulating layer, respectively; and a source extension region in said substrate at said substrate face adjacent said source region and extending toward said drain region, said source region and said source extension region being doped said second conductivity type at same doping concentration.

44. A field effect transistor according to claim 43 further comprising a drain extension region in said substrate at said substrate face adjacent said drain region and extending into said channel region, said drain region and said drain extension region being doped said second conductivity type at same doping concentration.

45. A field effect transistor comprising:

a semiconductor substrate of first conductivity type;

a tub region of second conductivity type in said substrate at a surface thereof;

spaced apart source and drain regions of said second conductivity type in said tub region;

a channel region of said second conductivity type in said tub region, between said spaced apart source and drain regions, and extending from said substrate surface;

a gate insulating layer on said substrate surface, between said spaced apart source and drain regions;

source, drain and gate electrodes contacting said source and drain regions and said gate insulating layer, respectively, and a source extension region in said substrate at said substrate face adjacent said source region and extending into said channel region, said source region and said source extension region being doped said second conductivity type at same doping concentration.

46. A field effect transistor according to claim 45 further comprising a drain extension region in said substrate at said substrate face adjacent said drain region and extending into said channel region, said drain region and said drain extension region being doped said second conductivity type at same doping concentration.

47. A field effect transistor according to claim 45 wherein said tub region has nonuniform tub depth.

48. A field effect transistor according to claim 45 wherein said tub region extends a first predetermined depth from said substrate surface to below at least one of said spaced apart source and drain regions and extends a second predetermined depth from said substrate surface to below said channel region, wherein said second predetermined depth is less than said first predetermined depth.

49. A field effect transistor comprising:

a semiconductor substrate of first conductivity type;

spaced apart source and drain regions of second conductivity type in said semiconductor substrate at a surface thereof;

a tub region of said second conductivity type in said substrate at a surface thereof, between said spaced apart source and drain regions;

a channel region of said second conductivity type in said tub region, between said spaced apart source and drain regions, and extending from said substrate surface;

a gate insulating layer on said substrate surface, between said spaced apart source and drain regions;

source, drain and gate electrodes contacting said source and drain regions and said gate insulating layer, respectively; and a source extension region in said substrate at said substrate face adjacent said source region and extending toward said drain region, said source region and said source extension region being doped said second conductivity type at same doping concentration.

50. A field effect transistor according to claim 49 further comprising a drain extension region in said substrate at said substrate face adjacent said drain region and extending into said channel region, said drain region and said drain extension region being doped said second conductivity type at same doping concentration.

51. A field effect transistor comprising:

a semiconductor substrate of first conductivity type;

a tub region of second conductivity type in said substrate at a surface thereof, and extending a first depth from said substrate surface;

spaced apart source and drain regions of said second conductivity type in said tub region, said spaced apart source and drain regions extending from said substrate surface to beyond said first depth;

a channel region of said second conductivity type in said tub region, between said spaced apart source and drain regions, and extending a second depth from said substrate surface, wherein said second depth is less than said first depth;

a gate insulating layer on said substrate surface, between said spaced apart source and drain regions; and source, drain and gate electrodes contacting said source and drain regions and said gate insulating layer, respectively;

said first depth being selected to initiate flow of carriers of said second conductivity type from said source region towards said drain region in said channel region, at said second depth upon application of the threshold voltage of said field effect transistor to said gate electrode.

52. A field effect transistor according to claim 51 wherein said first depth is further selected to allow said carriers of said second conductivity type to flow from said source region to said drain region in said channel region, extending from said second depth towards said substrate surface upon application of voltage to said gate electrode beyond the threshold voltage of said field effect transistor.

53. A field effect transistor according to claim 51 wherein said spaced apart source and drain regions further extend laterally away from one another, to beyond said tub region.

54. A field effect transistor according to claim 51 further comprising a source extension region in said substrate at said substrate face adjacent said source region and extending into said channel region, said source region and said source extension region being doped said second conductivity type at same doping concentration.

55. A field effect transistor according to claim 54 further comprising a drain extension region in said substrate at said substrate face adjacent said drain region and extending into said channel region, said drain region and said drain extension region being doped said second conductivity type at same doping concentration.

56. A field effect transistor comprising:

a semiconductor substrate of first conductivity type;

spaced apart source and drain regions of second conductivity type in said semiconductor substrate at a surface thereof;

a tub region of said second conductivity type in said substrate at a surface thereof, between said spaced apart source and drain regions, said tub region extending a first depth from said substrate surface, said source and drain regions extending into said substrate beyond said first depth;

a channel region of said second conductivity type in said tub region, between said spaced apart source and drain regions, and extending a second depth from said substrate surface, wherein said second depth is less than said first depth;

a gate insulating layer on said substrate surface, between said spaced apart source and drain regions; and source, drain and gate electrodes contacting said source and drain regions and said gate insulating layer, respectively;

said first depth being selected to initiate flow of carriers of said second conductivity type from said source region towards said drain region in said channel region, at said second depth upon application of the threshold voltage of said field effect transistor to said gate electrode.

57. A field effect transistor according to claim 51 wherein said first depth is further selected to allow said carriers of said second conductivity type to flow from said source region to said drain region in said channel region, extending from said second depth towards said substrate surface upon application of voltage to said gate electrode beyond the threshold voltage of said field effect transistor.

58. A field effect transistor according to claim 56 further comprising a source extension region in said substrate at said substrate face adjacent said source region and extending toward said drain region, said source region and said source extension region being doped said second conductivity type at same doping concentration.

59. A field effect transistor according to claim 58 further comprising a drain extension region in said substrate at said substrate face adjacent said drain region and extending into said channel region, said drain region and said drain extension region being doped said second conductivity type at same doping concentration.

* * * * *